United States Patent
Broyde et al.

(10) Patent No.: US 11,411,588 B2
(45) Date of Patent: Aug. 9, 2022

(54) METHOD OF AUTOMATIC ADJUSTMENT OF A TUNING UNIT, AND APPARATUS FOR RADIO COMMUNICATION USING THIS METHOD

(71) Applicant: TEKCEM, Maule (FR)

(72) Inventors: Frédéric Broyde, Maule (FR); Evelyne Clavelier, Maule (FR)

(73) Assignee: EXCEM

( * ) Notice: Subject to any disclaimer, the term of this patent is extended or adjusted under 35 U.S.C. 154(b) by 0 days.

(21) Appl. No.: 16/992,625

(22) Filed: Aug. 13, 2020

(65) Prior Publication Data

US 2020/0373951 A1    Nov. 26, 2020

Related U.S. Application Data

(63) Continuation of application No. PCT/IB2019/051501, filed on Feb. 25, 2019.

(30) Foreign Application Priority Data

Mar. 23, 2018   (FR) .................................... 18/70331

(51) Int. Cl.
*H04B 1/04* (2006.01)
*H03H 7/40* (2006.01)
*H04B 7/0413* (2017.01)

(52) U.S. Cl.
CPC ............. *H04B 1/0458* (2013.01); *H03H 7/40* (2013.01); *H04B 7/0413* (2013.01)

(58) Field of Classification Search
CPC ...... H04B 1/0458; H04B 7/0413; H04B 7/06; H03H 3/38; H03H 3/40; H03H 7/48; H03H 7/38; H03H 7/40; H01Q 21/00
See application file for complete search history.

(56) References Cited

U.S. PATENT DOCUMENTS 6,876,337 B2 * 4/2005 Larry .................... H01Q 3/267
 343/822
9,077,317 B2    7/2015 Broyde et al.
(Continued)

FOREIGN PATENT DOCUMENTS

WO    WO 2014/049475 A2    4/2014
WO    WO 2014/170766 A1    10/2014
(Continued)

OTHER PUBLICATIONS

"IEC Multilingual Dictionary of Electricity", Bureau Central de la Commission Electrotechnique Internationale, 1983.
(Continued)

*Primary Examiner* — Betsy Deppe
(74) *Attorney, Agent, or Firm* — Barnes & Thornburg LLP

(57) ABSTRACT

The invention relates to a method for automatically adjusting a multiple-input-port and multiple-output-port tuning unit. The invention also relates to an apparatus for radio communication using this method. An apparatus for radio communication of the invention comprises: 4 antennas which form a multiport antenna array; 4 feeders; a multiple-input-port and multiple-output-port tuning unit having 4
(Continued)

input ports and 4 output ports; 4 sensing units; a transmission and signal processing unit, which applies 4 excitations to the input ports, one and only one of the excitations being applied to each of the input ports, and which delivers tuning unit adjustment instructions; and a control unit, which delivers one or more tuning control signals to the multiple-input-port and multiple-output-port tuning unit.

9 Claims, 11 Drawing Sheets

(56) References Cited

U.S. PATENT DOCUMENTS

| | | | |
|---|---|---|---|
| 9,621,132 | B2 | 4/2017 | Broyde et al. |
| 9,966,930 | B2 | 5/2018 | Broyde et al. |
| 10,116,057 | B2 | 10/2018 | Broyde et al. |

FOREIGN PATENT DOCUMENTS

| | | |
|---|---|---|
| WO | WO 2016/207705 A1 | 12/2016 |
| WO | WO 2017/033048 A1 | 3/2017 |

OTHER PUBLICATIONS

Broyde et al., "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.

Broyde et al., "Two Multiple-Antenna-Port and Multiple-User-Port Antenna Tuners", proceedings of the 9th European Conference on Antenna and Propagation, EuCAP 2015, Apr. 2015.

Broyde et al., "A New Multiple-Antenna-Port and Multiple-User-Port Antenna Tuner", proceedings of the 2015 IEEE Radio & Wireless Week, RWW 2015, Jan. 2015.

Broyde et al., "A Tuning Computation Technique for a Multiple-Antenna-Port and Multiple-User-Port Antenna Tuner", International Journal of Antennas and Propagation, 2016.

Broyde et al., "A Typology of Antenna Tuner Control Schemes, for One or More Antennas", Excem Research Papers in Electronics and Electromagnetics, No. 1, 24 pages, doi: 10.5281/zenodo.3902749, Jun. 2020.

International search report relating to International Application No. PCT/IB2019/051501.

Information on search strategy relating to International Application No. PCT/IB2019/051501.

Written opinion of the international searching authority relating to International Application No. PCT/IB2019/051501.

\* cited by examiner

METHOD OF AUTOMATIC ADJUSTMENT OF A TUNING UNIT, AND APPARATUS FOR RADIO COMMUNICATION USING THIS METHOD

CROSS REFERENCE TO RELATED APPLICATIONS

This is a Continuation Application of PCT application No. PCT/IB2019/051501, filed 25 Feb. 2019, entitled "Method of automatic adjustment of a tuning unit, and apparatus for radio communication using this method", which in turn claims priority to French patent application No. FR1870331 of 23 Mar. 2018, entitled "Procédé pour réglage automatique d'une unité d'accord, et appareil pour communication radio utilisant ce procédé", both of which are incorporated herein by reference.

FIELD OF THE INVENTION

The invention relates to a method for automatically adjusting a multiple-input-port and multiple-output-port tuning unit, for instance a multiple-input-port and multiple-output-port tuning unit of a radio transmitter using several antennas simultaneously. The invention also relates to an apparatus for radio communication using this method, for instance a radio transceiver.

PRIOR ART

In what follows, in line with the "IEC multilingual dictionary of electricity" edited by the *Bureau Central de la Commission Electrotechnique Internationale* in 1983, "open-loop control" means control which does not utilize a measurement of the controlled variable, and "closed-loop control" (which is also referred to as "feedback control") means control in which the control action is made to depend on a measurement of the controlled variable.

Tuning an impedance matrix means obtaining that an impedance matrix presented by a plurality of input ports of a device approximates a wanted impedance matrix, and simultaneously offering an ideally lossless, or nearly lossless, transfer of power from the plurality of input ports to a plurality of output ports of the device, in a context where the impedance matrix seen by the plurality of output ports may vary. Thus, if the ports of a multiport signal generator presenting an impedance matrix equal to the hermitian adjoint (that is to say a matrix equal to the matrix transpose of the matrix complex conjugate) of the wanted impedance matrix are suitably connected to the plurality of input ports, said multiport signal generator delivers a maximum power to the plurality of input ports, and the plurality of output ports delivers a power near this maximum power.

A multiple-input-port and multiple-output-port tuning unit behaves, at any frequency in a given frequency band, with respect to its input ports and output ports, substantially as a passive linear device, where "passive" is used in the meaning of circuit theory. More precisely, a multiple-input-port and multiple-output-port tuning unit behaves, at any frequency in a given frequency band, with respect to its n output ports and m input ports, where n and m are nonzero integers, substantially as a passive linear (n+m)-port device. As a consequence of linearity, it is possible to define the impedance matrix presented by the input ports. As a consequence of passivity, the multiple-input-port and multiple-output-port tuning unit does not provide amplification. A multiple-input-port and multiple-output-port tuning unit comprises several adjustable impedance devices each having an adjustable reactance. Adjusting a multiple-input-port and multiple-output-port tuning unit means adjusting the reactance of one or more of its adjustable impedance devices. A multiple-input-port and multiple-output-port tuning unit may be used for tuning an impedance matrix. To tune an impedance matrix, the multiple-input-port and multiple-output-port tuning unit must be properly adjusted, that is to say, the reactances of its adjustable impedance devices must be properly adjusted.

An adjustable impedance device is a component comprising two terminals which substantially behave as the terminals of a passive linear two-terminal circuit element, and which are consequently characterized by an impedance which may depend on frequency, this impedance being adjustable.

An adjustable impedance device having a reactance which is adjustable by electrical means may be such that it only provides, at a given frequency, a finite set of reactance values, this characteristic being for instance obtained if the adjustable impedance device is:

a network comprising a plurality of capacitors or open-circuited stubs and one or more electrically controlled switches or change-over switches, such as electro-mechanical relays, or microelectromechanical switches, or PIN diodes or insulated-gate field-effect transistors, used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at a given frequency, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The U.S. Pat. No. 9,077,317, entitled "Method and apparatus for automatically tuning an impedance matrix, and radio transmitter using this apparatus", discloses a first method for automatically tuning an impedance matrix, this method using m or more different excitations applied successively to the input ports. Unfortunately, this method is usually not compatible with the specification of a radio transmitter used for MIMO wireless communication, because the generation of a sequence of m or more different excitations applied successively entails a prolonged emission of electromagnetic waves, which is usually not compatible with the requirements of all MIMO emission modes of applicable standards, for instance the LTE-Advanced standards.

This problem is solved in a second method for automatically tuning an impedance matrix, disclosed in the international application number PCT/IB2015/057131 of 16 Sep. 2015 (WO 2016/207705), in which the excitations need not be applied successively.

A block diagram of a system implementing the first method for automatically tuning an impedance matrix, or the second method for automatically tuning an impedance matrix, is shown in FIG. 1. This system is a part of an apparatus for radio communication. The system shown in FIG. 1 has m=4 user ports (311) (321) (331) (341), the m user ports presenting, at a given frequency, an impedance matrix referred to as "the impedance matrix presented by the user ports", the system comprising:

- n=4 antennas (11) (12) (13) (14), the n antennas operating simultaneously in a given frequency band, the n antennas forming a multiport antenna array (1);
- m sensing units (31) (32) (33) (34), each of the sensing units delivering two "sensing unit output signals", each of the sensing unit output signals being determined by one electrical variable sensed (or measured) at one of the user ports;
- a multiple-input-port and multiple-output-port tuning unit (4) having m input ports and n output ports, each of the input ports being coupled to one and only one of the user ports through one and only one of the sensing units, the multiple-input-port and multiple-output-port tuning unit comprising p adjustable impedance devices, where p is an integer greater than or equal to m, the p adjustable impedance devices being referred to as the "adjustable impedance devices of the tuning unit" and being such that, at said given frequency, each of the adjustable impedance devices of the tuning unit has a reactance, the reactance of any one of the adjustable impedance devices of the tuning unit being adjustable by electrical means;
- n feeders (21) (22) (23) (24), each of the feeders having a first end coupled to a signal port of one and only one of the antennas, each of the feeders having a second end coupled to one and only one of the output ports;
- a signal processing unit (5), the signal processing unit estimating q real quantities depending on the impedance matrix presented by the user ports, where q is an integer greater than or equal to m, using the sensing unit output signals caused by m excitations applied to the user ports, the signal processing unit delivering an "adjustment instruction" as a function of said q real quantities depending on the impedance matrix presented by the user ports; and
- a control unit (6), the control unit receiving the adjustment instruction from the signal processing unit (5), the control unit delivering "control signals", the control signals being determined as a function of the adjustment instruction, the reactance of each of the adjustable impedance devices of the tuning unit being mainly determined by at least one of the control signals.

The first method for automatically tuning an impedance matrix and the second method for automatically tuning an impedance matrix are based on closed-loop control. They typically provide either an accurate but slow automatic tuning requiring many iterations, or a fast but inaccurate automatic tuning requiring few iterations.

This problem is solved in a third method for automatically tuning an impedance matrix, disclosed in the international application number PCT/IB2015/057161 of 17 Sep. 2015 (WO 2017/033048). A block diagram of a system implementing the third method for automatically tuning an impedance matrix is shown in FIG. 2. This system is a part of an apparatus for radio communication. The system shown in FIG. 2 has m=4 user ports (311) (321) (331) (341), the m user ports presenting, at a given frequency, an impedance matrix referred to as "the impedance matrix presented by the user ports", the system comprising:

- n=4 antennas (11) (12) (13) (14), the n antennas operating simultaneously in a given frequency band, the n antennas forming a multiport antenna array (1);
- a multiple-input-port and multiple-output-port tuning unit (4) having m input ports and n output ports, each of the input ports being coupled to one and only one of the user ports, the multiple-input-port and multiple-output-port tuning unit comprising p adjustable impedance devices, where p is an integer greater than or equal to m, the p adjustable impedance devices being referred to as the "adjustable impedance devices of the tuning unit" and being such that, at said given frequency, each of the adjustable impedance devices of the tuning unit has a reactance, the reactance of any one of the adjustable impedance devices of the tuning unit being adjustable by electrical means;
- n sensing units (31) (32) (33) (34), each of the sensing units delivering two "sensing unit output signals", each of the sensing unit output signals being determined by one electrical variable sensed (or measured) at one of the output ports;
- n feeders (21) (22) (23) (24), each of the feeders having a first end which is directly coupled to a signal port of one and only one of the antennas, each of the feeders having a second end which is indirectly coupled to one and only one of the output ports, through one and only one of the sensing units;
- a signal processing unit (5), the signal processing unit estimating q real quantities depending on an impedance matrix seen by the output ports, where q is an integer greater than or equal to m, using the sensing unit output signals caused by m excitations applied to the user ports, the signal processing unit delivering an "adjustment instruction" as a function of said q real quantities depending on the impedance matrix seen by the output ports; and
- a control unit (6), the control unit receiving the adjustment instruction from the signal processing unit (5), the control unit delivering "control signals", the control signals being determined as a function of the adjustment instruction, the reactance of each of the adjustable impedance devices of the tuning unit being mainly determined by at least one of the control signals.

The third method for automatically tuning an impedance matrix is based on open-loop control, so that it may be fast, but it is typically inaccurate. Thus, the prior art does not teach a fast and accurate method for automatically tuning an impedance matrix.

SUMMARY OF THE INVENTION

The purpose of the invention is a method for automatically adjusting a multiple-input-port and multiple-output-port tuning unit, without the above-mentioned limitations of known techniques, and also an apparatus for radio communication using this method.

In what follows, X and Y being different quantities or variables, performing an action as a function of X does not preclude the possibility of performing this action as a function of Y. In what follows, "having an influence" and "having an effect" have the same meaning. In what follows, "coupled", when applied to two ports (in the meaning of circuit theory), may indicate that the ports are directly coupled, in which case each terminal of one of the ports is connected to (or, equivalently, in electrical contact with) one and only one of the terminals of the other port, and/or that the ports are indirectly coupled, in which case an electrical interaction different from direct coupling exists between the ports, for instance through one or more components.

The method of the invention is a method for automatically adjusting a multiple-input-port and multiple-output-port tuning unit, the multiple-input-port and multiple-output-port tuning unit having m input ports and n output ports, where m and n are each an integer greater than or equal to 2, the multiple-input-port and multiple-output-port tuning unit comprising p adjustable impedance devices, where p is an integer greater than or equal to m, the p adjustable impedance devices being referred to as the "adjustable impedance devices of the tuning unit" and being such that, at a given frequency, each of the adjustable impedance devices of the tuning unit has a reactance, the reactance of any one of the adjustable impedance devices of the tuning unit being adjustable by electrical means, the reactance of any one of the adjustable impedance devices of the tuning unit being mainly determined by at least one "tuning control signal", the multiple-input-port and multiple-output-port tuning unit being a part of an apparatus for radio communication comprising N antennas, where N is an integer greater than or equal to 2, the apparatus for radio communication allowing, at the given frequency, a transfer of power from the m input ports to an electromagnetic field radiated by the antennas, the method comprising the steps of:

selecting a frequency referred to as the "selected frequency";

applying m excitations to the m input ports, one and only one of the excitations being applied to each of the input ports, each of the excitations having a carrier frequency which is equal to the selected frequency;

generating, for each of the one or more tuning control signals, an initial value of said each of the one or more tuning control signals, as a function of one or more initial tuning unit adjustment instructions;

sensing one or more electrical variables at each of the input ports, to obtain "sensing unit output signals", each of the sensing unit output signals being mainly determined by at least one of the electrical variables sensed at one of the input ports;

estimating q tuning parameters by utilizing the sensing unit output signals, where q is an integer greater than or equal to m, each of the tuning parameters being a quantity depending on an impedance matrix presented by the input ports, said impedance matrix presented by the input ports being an impedance matrix presented by the input ports while each said initial value is generated; and generating, for at least one of the one or more tuning control signals, at least one subsequent value of said at least one of the one or more tuning control signals, as a function of:

one or more quantities determined by the selected frequency;

one or more variables determined by one or more of the one or more initial tuning unit adjustment instructions; and the q tuning parameters.

Each of the q tuning parameters may for instance be substantially proportional to the absolute value, or the phase, or the real part, or the imaginary part of an entry of said impedance matrix presented by the input ports, or of an entry of the inverse of said impedance matrix presented by the input ports (this inverse being an admittance matrix presented by the input ports), or of an entry of a matrix of voltage reflection coefficients at the input ports, defined as being equal to $(Z_{UT}-Z_O)(Z_{UT}+Z_O)^{-1}$, where $Z_O$ is a reference impedance matrix, and where $Z_{UT}$ is said impedance matrix presented by the input ports.

The given frequency and the selected frequency may for instance be frequencies greater than or equal to 150 kHz. The specialist understands that an impedance matrix seen by the output ports is a complex matrix of size n by n, and that an impedance matrix presented by the input ports is a complex matrix of size m by m. We will use $Z_{Sant}$ to denote the impedance matrix seen by the output ports, and $Z_U$ to denote the impedance matrix presented by the input ports. The impedance matrices $Z_{Sant}$ and $Z_U$ depend on the frequency. Moreover, $Z_U$ also depends on the one or more tuning control signals, so that the wording "impedance matrix presented by the input ports while each said initial value is generated" has a clear meaning.

Each of the N antennas has a port, referred to as the "signal port" of the antenna, which can be used to receive and/or to emit electromagnetic waves. It is assumed that each of the antennas behaves, at the given frequency, with respect to the signal port of the antenna, substantially as a passive antenna, that is to say as an antenna which is linear and does not use an amplifier for amplifying signals received by the antenna or signals emitted by the antenna. As a consequence of linearity, it is possible to define an impedance matrix presented by the antennas, the definition of which only considers, for each of the antennas, the signal port of the antenna. This matrix is consequently of size N×N. Because of the interactions between the antennas, this matrix need not be diagonal. In particular, the invention may for instance be such that this matrix is not a diagonal matrix.

It is said above that the apparatus for radio communication allows, at the given frequency, a transfer of power from the m input ports to an electromagnetic field radiated by the antennas. In other words, the apparatus for radio communication is such that, if a power is received by the m input ports at the given frequency, a part of said power received by the m input ports is transferred to an electromagnetic field radiated by the antennas at the given frequency, so that a power of the electromagnetic field radiated by the antennas at the given frequency is equal to said part of said power received by the m input ports. For instance, the specialist knows that a power of the electromagnetic field radiated by the antennas (average radiated power) can be computed as the flux of the real part of a complex Poynting vector of the electromagnetic field radiated by the antennas, through a closed surface containing the antennas.

To obtain that the apparatus for radio communication allows, at the given frequency, a transfer of power from the m input ports to an electromagnetic field radiated by the antennas, each of the antennas may, if n=N, for instance be coupled, directly or indirectly, to one and only one of the output ports, as shown below in the presentation of the first embodiment. More precisely, if n=N, for each of the antennas, the signal port of the antenna may for instance be coupled, directly or indirectly, to one and only one of the output ports. For instance, an indirect coupling may be a coupling through a feeder. For suitable values of the one or more tuning control signals, said transfer of power from the m input ports to an electromagnetic field radiated by the antennas may for instance be a transfer of power with small or negligible or zero losses, this characteristic being preferred.

The method of the invention may for instance be such that any diagonal entry of the impedance matrix presented by the input ports is influenced by the reactance of at least one of the adjustable impedance devices of the tuning unit. The method of the invention may for instance be such that the reactance of at least one of the adjustable impedance devices of the tuning unit has an influence on at least one non-diagonal entry of the impedance matrix presented by the input ports.

It is for instance possible that at least one of the one or more subsequent values is generated by utilizing a numerical model, as explained below in the sixth embodiment.

An apparatus implementing the method of the invention is an apparatus for radio communication comprising:

N antennas, where N is an integer greater than or equal to 2;

a multiple-input-port and multiple-output-port tuning unit having m input ports and n output ports, where m and n are each an integer greater than or equal to 2, the apparatus for radio communication allowing, at a given frequency, a transfer of power from the m input ports to an electromagnetic field radiated by the antennas, the multiple-input-port and multiple-output-port tuning unit comprising p adjustable impedance devices, where p is an integer greater than or equal to m, the p adjustable impedance devices being referred to as the "adjustable impedance devices of the tuning unit" and being such that, at the given frequency, each of the adjustable impedance devices of the tuning unit has a reactance, the reactance of any one of the adjustable impedance devices of the tuning unit being adjustable by electrical means;

m sensing units, each of the sensing units delivering one or more "sensing unit output signals", each of the sensing unit output signals being mainly determined by one or more electrical variables sensed at one of the input ports;

a transmission and signal processing unit, the transmission and signal processing unit delivering "tuning unit adjustment instructions", at least one of the tuning unit adjustment instructions being an "initial tuning unit adjustment instruction", at least one of the tuning unit adjustment instructions being a "subsequent tuning unit adjustment instruction"; and a control unit, the control unit delivering one or more "tuning control signals", the control unit generating, for each of the one or more tuning control signals, one or more values of said each of the one or more tuning control signals, each of said one or more values of said each of the one or more tuning control signals being determined as a function of at least one of the tuning unit adjustment instructions, the reactance of each of the adjustable impedance devices of the tuning unit being mainly determined by at least one of the one or more tuning control signals;

the apparatus for radio communication being characterized in that:

the transmission and signal processing unit selects a frequency referred to as the "selected frequency";

the transmission and signal processing unit is utilized to apply m excitations to the m input ports, one and only one of the excitations being applied to each of the input ports, each of the excitations having a carrier frequency which is equal to the selected frequency;

for each of the one or more tuning control signals, said one or more values of said each of the one or more tuning control signals comprise an initial value determined as a function of one or more of the one or more initial tuning unit adjustment instructions;

the transmission and signal processing unit estimates q tuning parameters by utilizing the sensing unit output signals, where q is an integer greater than or equal to m, each of the tuning parameters being a quantity depending on an impedance matrix presented by the input ports, said impedance matrix presented by the input ports being an impedance matrix presented by the input ports while each said initial value is generated; and at least one of the one or more subsequent tuning unit adjustment instructions is determined as a function of:
one or more quantities determined by the selected frequency;
one or more variables determined by one or more of the one or more initial tuning unit adjustment instructions; and
the q tuning parameters.

For instance, each of said electrical variables may be a voltage, or an incident voltage, or a reflected voltage, or a current, or an incident current, or a reflected current.

For instance, it is possible that the control unit is such that:
for each of the one or more tuning control signals, the initial value of said each of the one or more tuning control signals is determined as a function of one of the one or more initial tuning unit adjustment instructions; and
for one or more of the one or more tuning control signals, said one or more values of each said one or more of the one or more tuning control signals comprise at least one subsequent value determined as a function of one of the one or more subsequent tuning unit adjustment instructions.

In this case, it is for instance possible to say that the control unit generates: for each of the one or more tuning control signals, an initial value determined as a function of one of the one or more initial tuning unit adjustment instructions; and, for at least one of the one or more tuning control signals, at least one subsequent value determined as a function of one of the one or more subsequent tuning unit adjustment instructions. In this case, it is for instance possible to say that at least one subsequent value of said at least one of the one or more tuning control signals is generated as a function of:
one or more quantities determined by the selected frequency;
one or more variables determined by one or more of the one or more initial tuning unit adjustment instructions; and
the q tuning parameters.

As explained above, if n=N, it is for instance possible that each of the antennas is coupled, directly or indirectly, to one and only one of the output ports. As explained above, if n=N, it is for instance possible that, for each of the antennas, the signal port of the antenna is coupled, directly or indirectly, to one and only one of the output ports. Thus, it is for instance possible that said transfer of power (from the m input ports to an electromagnetic field radiated by the antennas) takes place through the multiple-input-port and multiple-output-port tuning unit. The integer p may be greater than or equal to 2m.

It is for instance possible that each of the m input ports is coupled, directly or indirectly, to a port of the transmission and signal processing unit, said port of the transmission and signal processing unit delivering one and only one of the excitations.

For instance, it is possible that the reactance of any one of the adjustable impedance devices of the tuning unit has an influence on an impedance matrix presented by the input ports.

It is for instance possible that at least one of the one or more subsequent tuning unit adjustment instructions is determined by utilizing a numerical model, as explained below in the sixth embodiment.

The specialist understands that the apparatus for radio communication of the invention is adaptive in the sense that the reactances of the adjustable impedance devices of the tuning unit are varied with time as a function of the sensing unit output signals, which are each mainly determined by one or more electrical variables.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
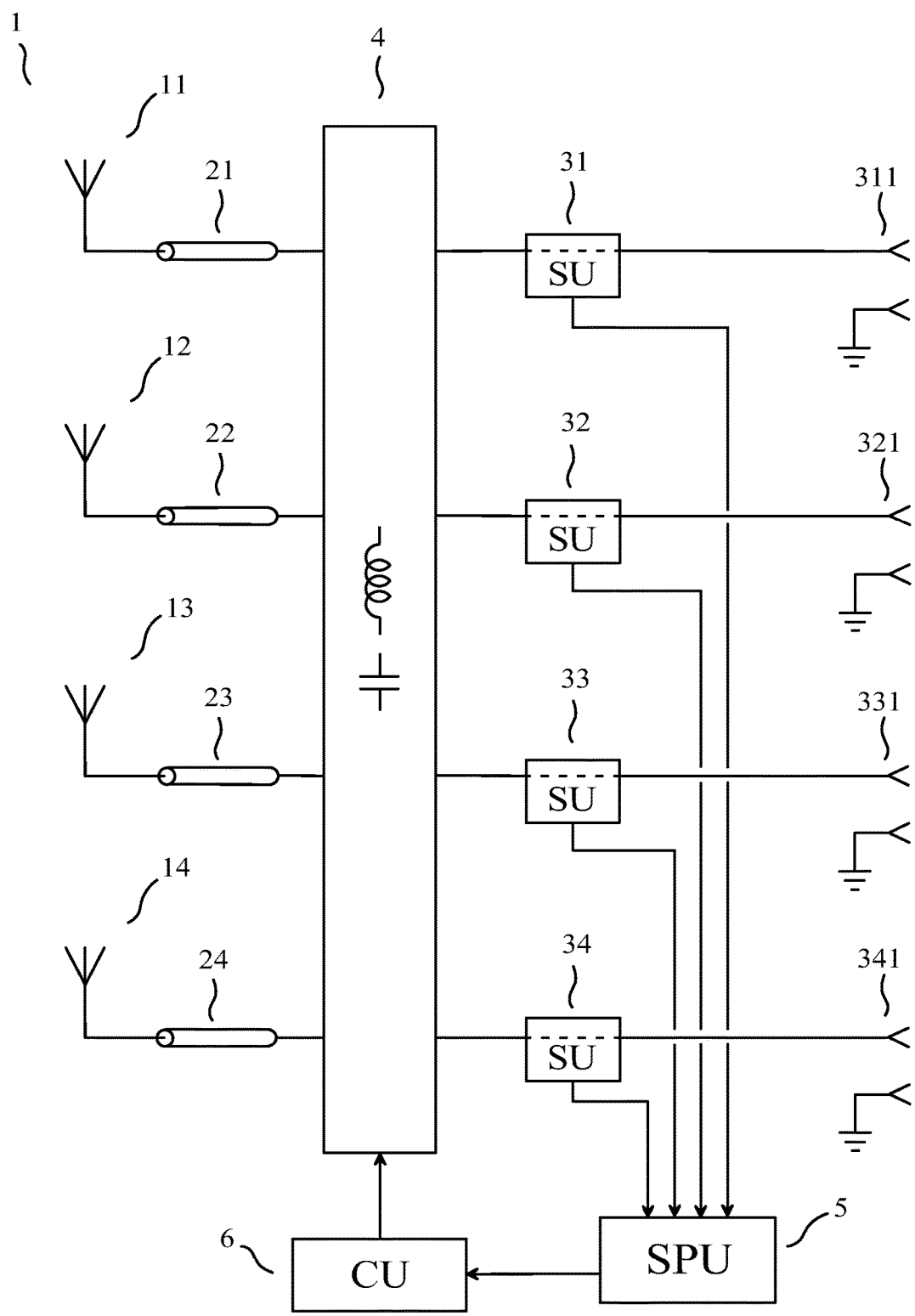
FIG. 1 shows a block diagram of an automatic adjustment system, and has already been discussed in the section dedicated to the presentation of the prior art.
Figure 2:
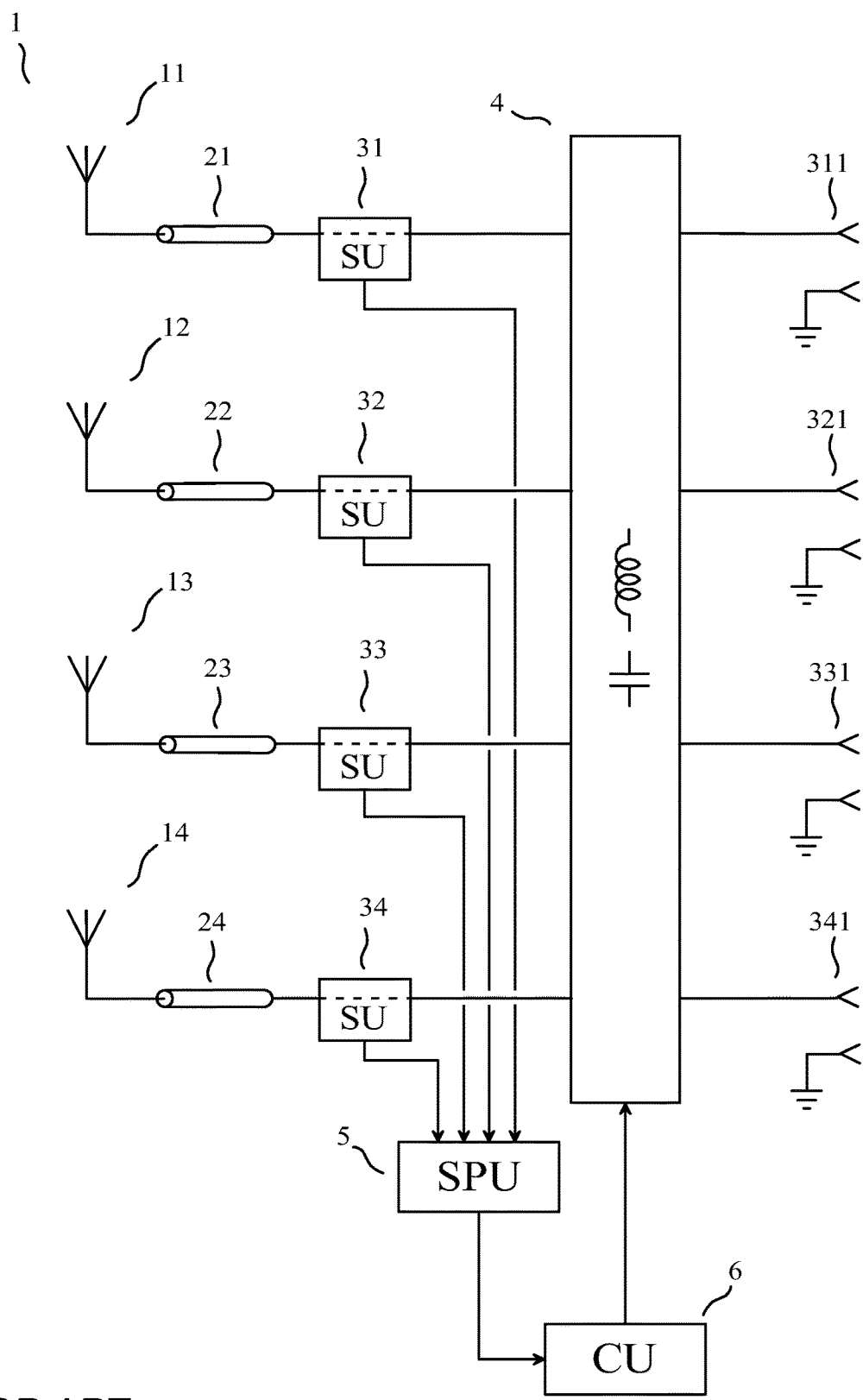
FIG. 2 shows a block diagram of an automatic adjustment system, and has already been discussed in the section dedicated to the presentation of the prior art.
Figure 3:
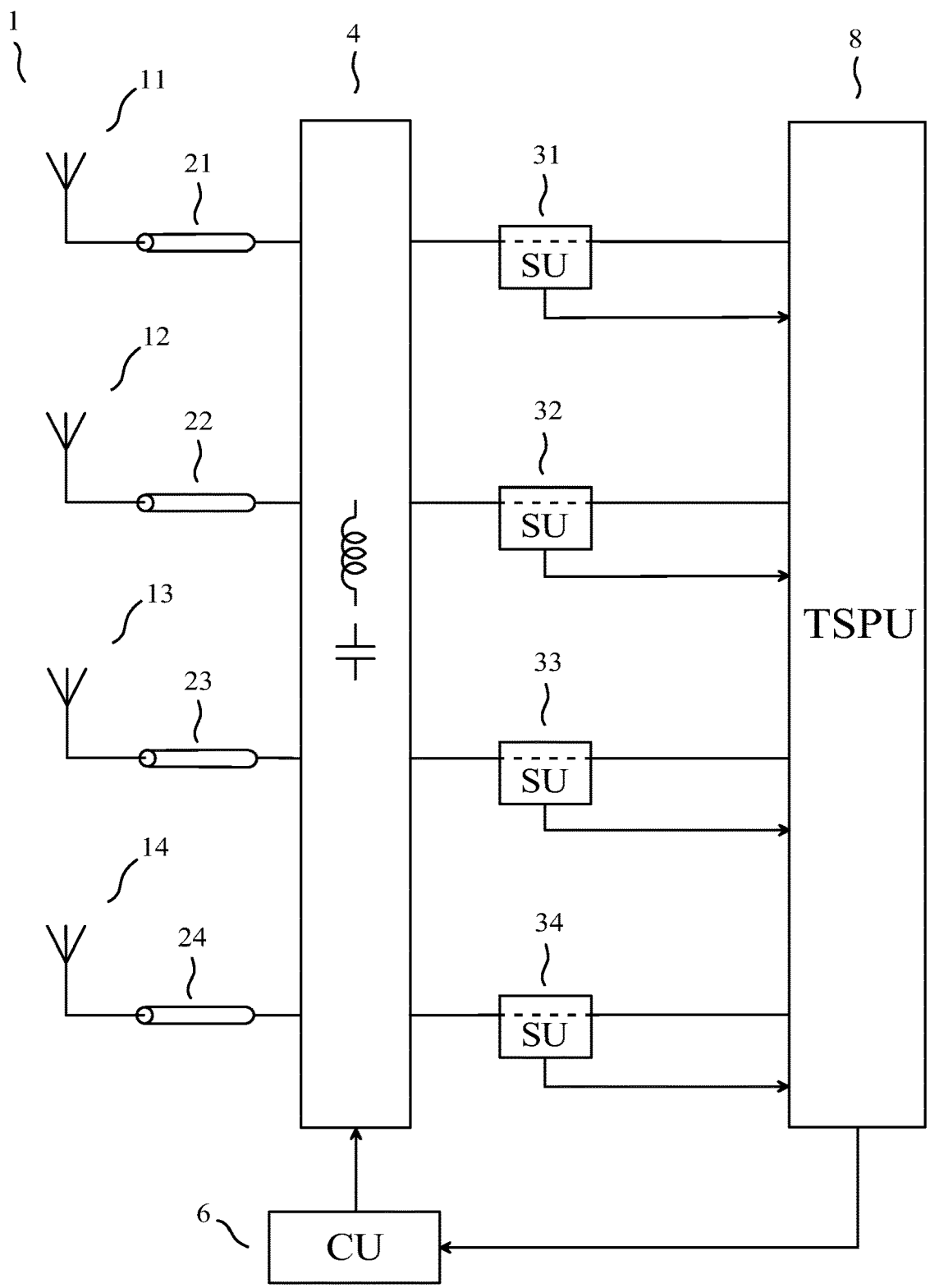
FIG. 3 shows a block diagram of an apparatus for radio communication of the invention (first embodiment)

As a first embodiment of a device of the invention, given by way of non-limiting example, we have represented in FIG. 3 the block diagram of an apparatus for radio communication comprising:
- N=4 antennas (11) (12) (13) (14), the antennas operating simultaneously in a given frequency band, the antennas forming a multiport antenna array (1);
- a multiple-input-port and multiple-output-port tuning unit (4) having m=4 input ports and n=N output ports, the multiple-input-port and multiple-output-port tuning unit comprising p adjustable impedance devices, where p is an integer greater than or equal to 2m=8, the p adjustable impedance devices being referred to as the "adjustable impedance devices of the tuning unit" and being such that, at a given frequency greater than or equal to 30 MHz, each of the adjustable impedance devices of the tuning unit has a reactance, the reactance of any one of the adjustable impedance devices of the tuning unit being adjustable by electrical means;
- m sensing units (31) (32) (33) (34), each of the sensing units delivering two "sensing unit output signals", each of the sensing unit output signals being mainly determined by one or more electrical variables sensed (or measured) at one of the input ports;
- N feeders (21) (22) (23) (24), each of the feeders having a first end which is directly coupled to a signal port of one and only one of the antennas, each of the feeders having a second end which is directly coupled to one and only one of the output ports;
- a transmission and signal processing unit (8), the transmission and signal processing unit selecting a frequency referred to as the "selected frequency", the transmission and signal processing unit applying m excitations to the m input ports through the sensing units, one and only one of the excitations being applied to each of the input ports, each of the excitations having a carrier frequency which is equal to the selected frequency, the transmission and signal processing unit delivering "tuning unit adjustment instructions", at least one of the tuning unit adjustment instructions being an "initial tuning unit adjustment instruction", at least one of the tuning unit adjustment instructions being a "subsequent tuning unit adjustment instruction"; and
- a control unit (6), the control unit receiving the tuning unit adjustment instructions, the control unit delivering one or more "tuning control signals" to the multiple-input-port and multiple-output-port tuning unit, the control unit generating, for each of the one or more tuning control signals, one or more values of said each of the one or more tuning control signals, each of said one or more values of said each of the one or more tuning control signals being determined as a function of at least one of the tuning unit adjustment instructions, the reactance of each of the adjustable impedance devices of the tuning unit being mainly determined by at least one of the one or more tuning control signals;

wherein:
- for each of the one or more tuning control signals, said one or more values of said each of the one or more tuning control signals comprise an initial value determined as a function of one or more of the one or more initial tuning unit adjustment instructions;
- the transmission and signal processing unit estimates q tuning parameters, where q is an integer greater than or equal to m, by utilizing the sensing unit output signals, each of the tuning parameters being a quantity depending on an impedance matrix presented by the input ports, said impedance matrix presented by the input ports being an impedance matrix presented by the input ports while each said initial value is generated; and
- at least one of the one or more subsequent tuning unit adjustment instructions is determined as a function of:
  - one or more quantities determined by the selected frequency;
  - one or more variables determined by one or more of the one or more initial tuning unit adjustment instructions; and
  - the q tuning parameters.

Each of the antennas is coupled to one and only one of the output ports. More precisely, for each of the antennas, the signal port of the antenna is indirectly coupled to one and only one of the output ports, through one and only one of the feeders. Moreover, each of the output ports is coupled to one and only one of the antennas. More precisely, each of the output ports is indirectly coupled to the signal port of one and only one of the antennas, through one and only one of the feeders. The given frequency lies in the given frequency band. The given frequency band only contains frequencies greater than or equal to 30 MHz.

The q tuning parameters are sufficient to allow a determination of an impedance matrix presented by the input ports. The wording "are sufficient to allow a determination of an impedance matrix presented by the input ports" does not imply that an impedance matrix presented by the input ports is determined, but it is possible that an impedance matrix presented by the input ports is determined.

The information carried by the sensing unit output signals must be sufficient to allow the signal processing unit to estimate the q tuning parameters. Each of the sensing units (31) (32) (33) (34) may for instance be such that the two sensing unit output signals delivered by said each of the sensing units comprise: a first sensing unit output signal proportional to a first electrical variable, the first electrical variable being a voltage across one of the input ports; and a second sensing unit output signal proportional to a second electrical variable, the second electrical variable being a current flowing in said one of the input ports. Said voltage across one of the input ports may be a complex voltage and said current flowing in said one of the input ports may be a complex current. Alternatively, each of the sensing units (31) (32) (33) (34) may for instance be such that the two sensing unit output signals delivered by said each of the sensing units comprise: a first sensing unit output signal proportional to a first electrical variable, the first electrical variable being an incident voltage (which may also be referred to as "forward voltage") at one of the input ports; and a second sensing unit output signal proportional to a second electrical variable, the second electrical variable being a reflected voltage at said one of the input ports. Said incident voltage at one of the input ports may be a complex incident voltage and said reflected voltage at said one of the input ports may be a complex reflected voltage.

Each of the m input ports is indirectly coupled to a port of the transmission and signal processing unit (8), through one and only one of the sensing units, said port of the transmission and signal processing unit delivering one and only one of the excitations. Each of the tuning unit adjustment instructions may be of any type of digital message. The tuning unit adjustment instructions are delivered during one or more adjustment sequences. Two different adjustment sequences are described below, in the sixth embodiment and in the ninth embodiment. The duration of an adjustment sequence is less than 100 microseconds.

For instance, it is possible that at least one of the excitations is an unmodulated carrier, the carrier frequency of said at least one of the excitations being the frequency of said carrier. For instance, it is possible that at least one of the excitations is an amplitude modulated carrier, the carrier frequency of said at least one of the excitations being the frequency of said carrier. For instance, it is possible that at least one of the excitations is a frequency modulated carrier, the carrier frequency of said at least one of the excitations being the frequency of said carrier. For instance, as explained in the presentation of the third embodiment, it is possible that at least one of the excitations is a bandpass signal, the carrier frequency of said at least one of the excitations being a carrier frequency of said bandpass signal.

The value of the selected frequency lies in a "set of possible values of the selected frequency", which comprises several elements. For instance, it is possible that the selected frequency may take on any value lying in the set of possible values of the selected frequency. Thus, it is possible that the carrier frequency of each of the excitations may take on any value lying in the set of possible values of the selected frequency.

The specialist understands that, to estimate the q tuning parameters, it is necessary to use sensing unit output signals, each of which is mainly determined by one or more electrical variables sensed at one of the input ports while at least one of the excitations is applied, and while, for each of the one or more tuning control signals, the initial value of said each of the one or more tuning control signals is generated.

The multiple-input-port and multiple-output-port tuning unit (4) is such that, at said given frequency, if the impedance matrix seen by the output ports is equal to a given non-diagonal impedance matrix, a mapping associating the impedance matrix presented by the input ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives. This must be interpreted as meaning: the multiple-input-port and multiple-output-port tuning unit is such that, at said given frequency, there exists a non-diagonal impedance matrix referred to as the given non-diagonal impedance matrix, the given non-diagonal impedance matrix being such that, if an impedance matrix seen by the output ports is equal to the given non-diagonal impedance matrix, then a mapping associating an impedance matrix presented by the input ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives.

The specialist knows that the dimension of the span of the p partial derivatives considered as a real vector space has been used and explained: in the international application number PCT/IB2013/058423 (WO 2014/049475); and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015. In said article, said dimension of the span of the p partial derivatives is referred to as the local dimension of the user port impedance range, and denoted by $D_{UR}(Z_{Sant})$. A specialist understands that, to obtain that any diagonal complex matrix of size m by m has the same diagonal entries as at least one element of the span of the p partial derivatives, it is necessary that the dimension of the span of the p partial derivatives considered as a real vector space is greater than or equal to the dimension of the subspace of the diagonal complex matrices of size m by m considered as a real vector space. Since the dimension of the span of the p partial derivatives considered as a real vector space is less than or equal to p, and since the dimension of the subspace of the diagonal complex matrices of size m by m considered as a real vector space is equal to 2m, the necessary condition implies that p is an integer greater than or equal to 2m. This is why the requirement "p is an integer greater than or equal to 2m" is an essential characteristic of this embodiment.

The multiple-input-port and multiple-output-port tuning unit (4) is such that it can provide, at said given frequency, for suitable values of the one or more tuning control signals, a low-loss transfer of power from the input ports to the output ports, and a low-loss transfer of power from the output ports to the input ports.

The output ports being indirectly coupled to the antennas, the specialist sees that the apparatus for radio communication allows, at the given frequency, a transfer of power from the m input ports to an electromagnetic field radiated by the antennas. In other words, the apparatus for radio communication is such that, if a power is received by the m input ports at the given frequency, a part of said power received by the m input ports is transferred to an electromagnetic field radiated by the antennas at the given frequency, so that a power of the electromagnetic field radiated by the antennas at the given frequency is equal to said part of said power received by the m input ports. The apparatus for radio communication also allows, at said given frequency, a transfer of power from an electromagnetic field incident on the antennas to the m input ports. Additionally, the multiple-input-port and multiple-output-port tuning unit (4) and the antennas (11) (12) (13) (14) are such that, at said given frequency, for suitable values of the one or more tuning control signals, a low-loss transfer of power from the m input ports to an electromagnetic field radiated by the antennas can be obtained (for radio emission), and a low-loss transfer of power from an electromagnetic field incident on the antennas to the m input ports can be obtained (for radio reception). Thus, it is possible to say that the apparatus for radio communication allows, at said given frequency, for suitable values of the one or more tuning control signals, a low-loss transfer of power from the m input ports to an electromagnetic field radiated by the antennas, and a low-loss transfer of power from an electromagnetic field incident on the antennas to the m input ports.

The suitable values of the one or more tuning control signals are provided automatically. Thus, the specialist understands that any small variation in the impedance matrix seen by the output ports can be at least partially compensated with a new automatic adjustment of the adjustable impedance devices of the tuning unit. Since each of the tuning parameters is a quantity depending on an impedance matrix presented by the input ports while said initial values are generated, it follows that the apparatus for radio communication uses a closed-loop control scheme to determine the one or more subsequent tuning unit adjustment instructions.

The apparatus for radio communication is a portable radio transceiver, so that the transmission and signal processing unit (8) also performs functions which have not been mentioned above, and which are well known to specialists. For instance, the apparatus for radio communication can be a user equipment (UE) of an LTE-advanced wireless network, or of a 5G New Radio wireless network.

The specialist understands that $Z_{Sant}$ depends on the frequency and on the electromagnetic characteristics of the volume surrounding the antennas. In particular, the body of the user has an effect on $Z_{Sant}$, and $Z_{Sant}$ depends on the position of the body of the user. This is referred to as "user interaction", or "hand effect" or "finger effect". The specialist understands that the apparatus for radio communication may automatically compensate a variation in $Z_{Sant}$ caused by a variation in a frequency of operation, and/or automatically compensate the user interaction.

In order to respond to variations in the electromagnetic characteristics of the volume surrounding the antennas and/or in the frequency of operation, a new adjustment sequence starts shortly after each change of the frequency of operation, and no later than 10 milliseconds after the beginning of the previous adjustment sequence.

In this first embodiment, N=n=m=4. Thus, it is possible that N is greater than or equal to 3, it is possible that N is greater than or equal to 4, it is possible that n is greater than or equal to 3, it is possible that n is greater than or equal to 4, it is possible that m is greater than or equal to 3, and it is possible that m is greater than or equal to 4.

Second Embodiment

The second embodiment of a device of the invention, given by way of non-limiting example, also corresponds to the apparatus for radio communication shown in FIG. 3, and all explanations provided for the first embodiment are applicable to this second embodiment. Additionally, in this second embodiment, the m excitations are applied successively to the input ports, that is to say: the m excitations are applied one after another to the input ports. Thus, for instance, it is not possible that two or more of the excitations are applied simultaneously. Each of the m excitations applied successively to the input ports may for instance comprise a sinusoidal signal at said given frequency, for instance a sinusoidal current at said given frequency applied to one and only one of the input ports, said one and only one of the input ports being a different input port for each of the m excitations. Each of the m excitations applied successively to the input ports may for instance comprise a sinusoidal signal at a frequency different from said given frequency, or a non-sinusoidal signal.

The transmission and signal processing unit is used to successively apply the m excitations to the input ports. For instance, if the input ports are numbered from 1 to m, if the excitations are numbered from 1 to m, and if a is any integer greater than or equal to 1 and less than or equal to m, the excitation number a may consist of a voltage applied to the input port number a and no voltage applied to the other input ports, or consist of a current applied to the input port number a and no current applied to the other input ports.

In this second embodiment, $q=2m^2$ and the q tuning parameters fully determine an impedance matrix presented by the input ports, said impedance matrix presented by the input ports being an impedance matrix presented by the input ports while, for each of the one or more tuning control signals, the initial value of said each of the one or more tuning control signals is generated. Also, the two sensing unit output signals of each of said sensing units are proportional to a complex voltage across one of the input ports and to a complex current flowing in said one of the input ports, respectively, as explained above. To explain how the transmission and signal processing unit (8) can use the sensing unit output signals caused by the m excitations applied successively to the input ports, to estimate q tuning parameters which are sufficient to allow a determination of an impedance matrix presented by the input ports, said impedance matrix presented by the input ports being an impedance matrix presented by the input ports while the one or more initial values are generated, we are going to consider two examples of signal processing.

In the first example of signal processing, we assume that, while the one or more initial values are generated, for any integer a greater than or equal to 1 and less than or equal to m, the excitation number a consists of a current at the given frequency applied to the input port number a and no current applied to the other input ports. The input ports see an impedance matrix $Z_{LOC}$, and the excitation number a causes a vector of the open-circuit voltages at the ports of the transmission and signal processing unit, denoted by $V_{UPOCa}$. Here, $Z_{LOC}$ is a complex matrix of size m by m and $V_{UPOCa}$ is a complex vector of size m by 1 which is proportional to column a of $Z_{LOC}$. The specialist sees that, while the excitation number a is being applied, the vector of the complex currents measured by the sensing units is given by $$I_{UPa}=(Z_U+Z_{LOC})^{-1}V_{UPOCa} \quad (1)$$

and the vector of the complex voltages measured by the sensing units is given by $$V_{UPa}=Z_U I_{UPa} \quad (2)$$

in which $I_{UPa}$ is given by equation (1).

Let $I_{UP}$ be the complex matrix of size m by m whose column vectors are $I_{UP1}, \ldots, I_{UPm}$, and let $V_{UP}$ be the complex matrix of size m by m whose column vectors are $V_{UP1}, \ldots, V_{UPm}$. We have $$V_{UP}=Z_U I_{UP} \quad (3)$$

The matrices $Z_{LOC}$ and $Z_U+Z_{LOC}$ being each the impedance matrix of a strictly passive network, their hermitian parts are positive definite, so that, according to the Ostrowski-Taussky inequality, their determinants are positive. Thus, $Z_{LOC}$ and $Z_U+Z_{LOC}$ are invertible. Thus, $I_{UP}$ is correctly defined by equation (1). Also, it may easily be shown that $I_{UP}$ is the product of three terms: the inverse of $Z_U+Z_{LOC}$, $Z_{LOC}$ and an invertible diagonal matrix. Thus $I_{UP}$ is invertible, so that $$Z_U=V_{UP}I_{UP}^{-1} \quad (4)$$

Since, for each entry of $V_{UP}$ or of $I_{UP}$, one of the sensing unit output signals is, while one of the excitations is being applied, proportional to this entry of $V_{UP}$ or of $I_{UP}$, the transmission and signal processing unit can use equation (4) to compute $Z_U$. Thus, in the first example of signal processing, said q tuning parameters may consist of $m^2$ real numbers each proportional to the real part of an entry of $Z_U$ and of $m^2$ real numbers each proportional to the imaginary part of an entry of $Z_U$.

In the second example of signal processing, we assume that, while the one or more initial values are generated, for any integer a greater than or equal to 1 and less than or equal to m, the excitation number a consists of a voltage at the given frequency applied to the input port number a and a zero voltage applied to the other input ports. The input ports see an impedance matrix $Z_{LSC}$, and the excitation number a causes a vector of the open-circuit voltages at the ports of the transmission and signal processing unit, denoted by $V_{UPSCa}$. Here, $Z_{LSC}$ is a complex matrix of size m by m and $V_{UPSCa}$ is a complex vector of size m by 1 the entries of which are zero except the entry of row a. The specialist sees that, while the excitation number a is being applied, the vector of the complex currents measured by the sensing units is given by $$I_{UPa}=(Z_U+Z_{LSC})^{-1}V_{UPSCa} \quad (5)$$

and the vector of the complex voltages measured by the sensing units is given by equation (2) in which $I_{UPa}$ is given by equation (5).

Let $I_{UP}$ be the complex matrix of size m by m whose column vectors are $I_{UP1}, \ldots, I_{UPm}$, and let $V_{UP}$ be the complex matrix of size m by m whose column vectors are $V_{UP1}, \ldots, V_{UPm}$. The matrices $I_{UP}$ and $V_{UP}$ of this second example of signal processing may be completely different from the matrices $I_{UP}$ and $V_{UP}$ of the first example of signal processing. However, they satisfy equation (3). The matrix $Z_U+Z_{LSC}$ being the impedance matrix of a strictly passive network, $Z_U+Z_{LSC}$ is invertible (as explained above for $Z_{LOC}$ and $Z_U+Z_{LOC}$), so that $I_{UP}$ is correctly defined by equation (5). It may easily be shown that $I_{UP}$ is the product of the inverse of $Z_U+Z_{LSC}$ and an invertible diagonal matrix. Thus, $I_{UP}$ is invertible, so that the matrices $I_{UP}$ and $V_{UP}$ of this second example of signal processing also satisfy equation (4). Thus, the transmission and signal processing unit can use equation (4) to compute $Z_U$. Thus, in the second example of signal processing, said q tuning parameters may consist of $m^2$ real numbers each proportional to the real part of an entry of $Z_U$ and of $m^2$ real numbers each proportional to the imaginary part of an entry of $Z_U$. Alternatively, said q tuning parameters may consist of $m^2$ real numbers each proportional to the absolute value of an entry of $Z_U$ and of $m^2$ real numbers each proportional to the argument of an entry of $Z_U$.

Third Embodiment

The third embodiment of a device of the invention, given by way of non-limiting example, also corresponds to the apparatus for radio communication shown in FIG. 3, and all explanations provided for the first embodiment are applicable to this third embodiment. Additionally, in this third embodiment, the m excitations are not applied successively to the input ports, that is to say: the m excitations are not applied one after another to the input ports. Thus, for instance, it is possible that two or more of the excitations are applied simultaneously to the input ports. Thus, for instance, it is possible that the m excitations are applied simultaneously to the input ports.

Moreover, in this third embodiment, each of the excitations is a bandpass signal. This type of signal is sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\ S(f_C+f)$ in this interval, where k is a real constant which is chosen equal to the square root of 2 by some authors. The real part of $s_B(t)$ is referred to as the in-phase component, and the imaginary part of $s_B(t)$ is referred to as the quadrature component. The specialist knows that the bandpass signal s(t) may for instance be obtained:

as the result of a phase and amplitude modulation of a single carrier at the frequency $f_C$;

as a linear combination of a first signal and a second signal, the first signal being the product of the in-phase component and a first sinusoidal carrier of frequency $f_C$, the second signal being the product of the quadrature component and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible.

The complex envelope of the real signal s(t) clearly depends on the choice of a carrier frequency $f_C$. However, for a given carrier frequency, the complex envelope of the real signal s(t) is uniquely defined, for a given choice of the real constant k.

One and only one of said m excitations is applied to each of the input ports, two or more of the excitations being applied simultaneously. Each of said m excitations is a bandpass signal having a passband which contains said given frequency. Said given frequency being considered as a carrier frequency, each of the excitations has one and only one complex envelope (or complex baseband equivalent), the m complex envelopes of the m excitations being linearly independent in E, where E is the set of complex functions of one real variable, regarded as a vector space over the field of complex numbers.

Let us number the input ports from 1 to m, and let us number the excitations from 1 to m, in such a way that, if a is an integer greater than or equal to 1 and less than or equal to m, the excitation number a is applied to the input port number a. For instance, if we use t to denote time, the excitations may be such that, for any integer a greater than or equal to 1 and less than or equal to m, the excitation number a consists of a current $i_a(t)$, of complex envelope $i_{Ea}(t)$, applied to the input port number a, the complex envelopes $i_{E1}(t), \ldots, i_{Em}(t)$ being linearly independent in E. It is possible to show that, if the bandwidth of the complex envelopes $i_{E1}(t), \ldots, i_{Em}(t)$ is sufficiently narrow, then for any integer a greater than or equal to 1 and less than or equal to m, any voltage or current measured at anyone of the input ports and caused by the excitation number a is a bandpass signal whose complex envelope is proportional to $i_{Ea}(t)$, the coefficient of proportionality being complex and time-independent. Thus, if we use S to denote the span of $i_{E1}(t), \ldots, i_{Em}(t)$ in E, it is possible to say that: $i_{E1}(t), \ldots, i_{Em}(t)$ is a basis of S; any voltage or current measured at anyone of the input ports and caused by the excitations is a bandpass signal whose complex envelope lies in S; and, for any integer a greater than or equal to 1 and less than or equal to m, the product of the a-th coordinate of the complex envelope of this voltage or current in the basis $i_{E1}(t), \ldots, i_{Em}(t)$ and the vector $i_{Ea}(t)$ is equal to the part of the complex envelope of this voltage or current which is caused by the excitation number a. Consequently, the contributions of the different excitations can be identified with suitable signal processing, as if the different excitations had been applied successively to the input ports.

The specialist sees that, once this has been done, the first example of signal processing of the second embodiment can be adapted to the context of this third embodiment, to obtain q tuning parameters which fully determine an impedance matrix presented by the input ports, each of the tuning parameters being a real quantity depending on said impedance matrix presented by the input ports, said impedance matrix presented by the input ports being an impedance matrix presented by the input ports while, for each of the one or more tuning control signals, the initial value of said each of the one or more tuning control signals is generated.

More precisely, in an example of signal processing, we assume that, while the one or more initial values are generated, for any integer a greater than or equal to 1 and less than or equal to m, the excitation number a consists of a current $i_a(t)$, of complex envelope $i_{Ea}(t)$, applied to the input port number a, the complex envelopes $i_{E1}(t), \ldots, i_{Em}(t)$ being linearly independent in E. The input ports see an impedance matrix $Z_{LOC}$, and the excitations cause: m open-circuit voltages at the ports of the transmission and signal processing unit, of complex envelopes $v_{UPOC1}(t), \ldots, v_{UPOCm}(t)$; m currents flowing in the input ports, of complex envelopes $i_{UP1}(t), \ldots, i_{UPm}(t)$; and m voltages across the input ports, of complex envelopes $v_{UP1}(t), \ldots, v_{UPm}(t)$. As explained above, if the bandwidth of the complex envelopes $i_{E1}(t), \ldots, i_{Em}(t)$ is sufficiently narrow, for any integer a greater than or equal to 1 and less than or equal to m, the product of the a-th coordinate of each of these complex envelopes in the basis $i_{E1}(t), \ldots, i_{Em}(t)$ and the vector $i_{Ea}(t)$ is equal to the part of said each of these complex envelopes which is caused by the excitation number a. We can use $u_{UPOCa}$ to denote the column vector of the a-th coordinates of the complex envelopes $v_{UPOC1}(t), \ldots, v_{UPOCm}(t)$ in this basis. Likewise, we can use $j_{UPa}$ to denote the column vector of the a-th coordinates of the complex envelopes $i_{UP1}(t), \ldots, i_{UPm}(t)$ in this basis. Likewise, we can use $u_{UPa}$ to denote the column vector of the a-th coordinates of the complex envelopes $v_{UP1}(t), \ldots, v_{UPm}(t)$ in this basis. Here, $Z_{LOC}$ is a complex matrix of size m by m, and $u_{UPOCa}, j_{UPa}$, and $u_{UPa}$ are complex vectors of size m by 1. The specialist sees that $$j_{UPa} = (Z_U + Z_{LOC})^{-1} u_{UPOCa} \qquad (6)$$

and $$u_{UPa} = Z_U j_{UPa} \qquad (7)$$

Let $J_{UP}$ be the complex matrix of size m by m whose column vectors are $j_{UP1}, \ldots, j_{UPm}$, and let $U_{UP}$ be the complex matrix of size m by m whose column vectors are $u_{UP1}, \ldots, u_{UPm}$. We have $$U_{UP} = Z_U J_{UP} \qquad (8)$$

As explained in the second embodiment, $Z_{LOC}$ and $Z_U + Z_{LOC}$ are invertible. Thus, $J_{UP}$ is correctly defined by equation (6). Also, it may easily be shown that $J_{UP}$ is the product of three terms: the inverse of $Z_U + Z_{LOC}$, $Z_{LOC}$ and an invertible matrix. Thus, $J_{UP}$ is invertible, so that $$Z_U = U_{UP} J_{UP}^{-1} \qquad (9)$$

The specialist understands how the sensing unit output signals can be processed to obtain the entries of $U_{UP}$ and of $J_{UP}$. For instance, let us assume that, for any integer b greater than or equal to 1 and less than or equal to m, the sensing unit number b delivers: a first sensing unit output signal proportional to the voltage across the input port number b; and a second sensing unit output signal proportional to the current flowing in this input port. The transmission and signal processing unit may for instance perform an in-phase/quadrature (I/Q) demodulation (homodyne reception) of these sensing unit output signals, to obtain, for any integer b greater than or equal to 1 and less than or equal to m, four analog signals: the real part of $v_{UPb}(t)$; the imaginary part of $v_{UPb}(t)$; the real part of $i_{UPb}(t)$; and the imaginary part of $i_{UPb}(t)$. These analog signals may then be converted into digital signals and further processed in the digital domain, to estimate the coordinates of the complex envelope of the voltage across the input port number b in the basis $i_{E1}(t), \ldots, i_{Em}(t)$, that is to say the row b of $U_{UP}$, and to estimate the coordinates of the complex envelope of the current flowing in the input port number b in the basis $i_{E1}(t), \ldots, i_{Em}(t)$, that is to say the row b of $J_{UP}$. In this manner, all entries of $U_{UP}$ and of $J_{UP}$ can be obtained.

Once the entries of $U_{UP}$ and of $J_{UP}$ have been obtained, equation (9) can be used to compute $Z_U$ and/or its inverse $Y_U$. Thus, in this example of signal processing, said q tuning parameters may consist of $m^2$ real numbers each proportional to the real part of an entry of $Y_U$ and of $m^2$ real numbers each proportional to the imaginary part of an entry of $Y_U$.

This example of signal processing shows that, in an embodiment where the m excitations are not applied successively, the effects of the different excitations can be identified with suitable signal processing, as if the different excitations had been applied successively to the input ports, so that the m excitations can be used to estimate said impedance matrix presented by the input ports, and any quantity depending on said impedance matrix presented by the input ports.

We observe that, in standards typically applicable to MIMO wireless networks, signals having complex envelopes which are linearly independent in E are used as reference signals (also referred to as pilot signals) for MIMO channel estimation. We see that these signals used as reference signals, if they are applied to the input ports, can be used as excitations having complex envelopes which are linearly independent in E. Consequently, this third embodiment is compatible with the requirements of standards typically applicable to MIMO wireless networks. This question is further discussed below, in the fifth embodiment.

In this third embodiment, $q=2m^2$ and the q tuning parameters fully determine an impedance matrix presented by the input ports, said impedance matrix presented by the input ports being an impedance matrix presented by the input ports while the one or more initial values are generated. For instance, as said above, said q tuning parameters may consist of $m^2$ real numbers each proportional to the real part of an entry of $Y_U$ and of $m^2$ real numbers each proportional to the imaginary part of an entry of $Y_U$. For instance, said q tuning parameters may consist of $m^2$ real numbers each proportional to the absolute value of an entry of $Y_U$ and of $m^2$ real numbers each proportional to the argument of an entry of $Y_U$.

Fourth Embodiment

The fourth embodiment of a device of the invention, given by way of non-limiting example, also corresponds to the apparatus for radio communication shown in FIG. 3, and all explanations provided for the first embodiment and for the third embodiment are applicable to this fourth embodiment. Additionally, in this fourth embodiment, the complex envelopes of the m excitations are orthogonal to each other. More precisely, the complex envelopes of the m excitations are orthogonal to one another, for a given scalar product. Moreover, the scalar product of any one of the m complex envelopes and itself is nonzero, so that the orthogonality requirements entail that the m complex envelopes are linearly independent. We may use <f|g> to denote the scalar product of two functions f and g, which may be any scalar product satisfying the properties of conjugate symmetry, linearity in the second argument, and positivity (we do not require positive definiteness). For instance, we may consider that each of said complex envelope is square-integrable, and that the scalar product is the usual scalar product of the Hilbert space of square-integrable functions of a real variable, which, for two square-integrable functions f and g, is given by $$\langle f | g \rangle = \int_{-\infty}^{\infty} \overline{f(x)} g(x) dx \qquad (10)$$

in which the bar above f(x) denotes the complex conjugate. Alternatively, we may for instance consider that two functions f and g are sampled at the same points in time, to obtain the samples f[j] off and the samples g[j] of g, where j is an integer, and that the scalar product is the usual scalar product of finite energy sequences, which is given by $$\langle f | g \rangle = \sum_{j=-\infty}^{\infty} \overline{f[j]} g[j] \qquad (11)$$

Let us for instance consider the case in which the excitations are such that, while the one or more initial values are generated, for any integer a greater than or equal to 1 and less than or equal to m, the excitation number a consists of a current $i_a(t)$, of complex envelope $i_{Ea}(t)$, applied to the input port number a, the complex envelopes $i_{E1}(t), \ldots, i_{Em}(t)$ being orthogonal to each other. In this case, equation (9) is applicable, and the entries of $U_{UP}$ and of $J_{UP}$ can be easily computed, since, for any integer a greater than or equal to 1 and less than or equal to m, and for any integer b greater than or equal to 1 and less than or equal to m, the entry of the row b and the column a of $J_{UP}$, that is to say the b-th entry of the vector $j_{UPa}$, that is to say the a-th coordinate of the complex envelope $i_{UPb}(t)$ in the basis $i_{E1}(t), \ldots, i_{Em}(t)$, is clearly given by $$j_{ba} = \frac{\langle i_{Ea} | i_{UPb} \rangle}{\langle i_{Ea} | i_{Ea} \rangle} \qquad (12)$$

and the entry of the row b and the column a of $U_{UP}$, that is to say the b-th entry of the vector $u_{UPa}$, that is to say the a-th coordinate of the complex envelope $v_{UPb}(t)$ in said basis, is clearly given by $$u_{ba} = \frac{\langle i_{Ea} | v_{UPb} \rangle}{\langle i_{Ea} | i_{Ea} \rangle} \qquad (13)$$

For instance, let us assume that, for any integer b greater than or equal to 1 and less than or equal to m, the sensing unit number b delivers: a first sensing unit output signal proportional to the voltage across the input port number b; and a second sensing unit output signal proportional to the current flowing in this input port. The transmission and signal processing unit may for instance perform a down-conversion of all sensing unit output signals, followed by an in-phase/quadrature (I/Q) demodulation (heterodyne reception), to obtain, for any integer b greater than or equal to 1 and less than or equal to m, four analog signals: the real part of $v_{UPb}(t)$; the imaginary part of $v_{UPb}(t)$; the real part of $i_{UPb}(t)$; and the imaginary part of $i_{UPb}(t)$. These analog signals may then be converted into digital signals and further processed in the digital domain, based on equations (12) and (13), to estimate all entries of $U_{UP}$ and of $J_{UP}$.

We have just considered, as an example, the case in which the excitations are such that, while the one or more initial values are generated, for any integer a greater than or equal to 1 and less than or equal to m, the excitation number a consists of a current $i_a(t)$, of complex envelope $i_{Ea}(t)$, applied to the input port number a, the complex envelopes $i_{E1}(t), \ldots, i_{Em}(t)$ being orthogonal to each other. We have shown that, in this case, the effects of the different excitations can be easily identified, as if the different excitations had been applied successively to the input ports, so that the m excitations can be used to estimate an impedance matrix presented by the input ports, and any quantity depending on said impedance matrix presented by the input ports, said impedance matrix presented by the input ports being an impedance matrix presented by the input ports while the one or more initial values are generated. Alternatively, the excitations could for instance be such that, while the one or more initial values are generated, for any integer a greater than or equal to 1 and less than or equal to m, the excitation number a consists of a voltage $v_a(t)$, of complex envelope $v_{Ea}(t)$, applied to the input port number a, the complex envelopes $v_{E1}(t), (t), \ldots, v_{Em}(t)$ being orthogonal to each other. In this case, using a proof similar to the one presented above for applied currents, we can show that the effects of the different excitations can be easily identified, as if the different excitations had been applied successively to the input ports, so that the m excitations can be used to estimate an impedance matrix presented by the input ports, and any quantity depending on said impedance matrix presented by the input ports, said impedance matrix presented by the input ports being an impedance matrix presented by the input ports while the one or more initial values are generated.

The specialist understands how to generate m excitations having complex envelopes which are orthogonal to one another. For instance, let us consider m arbitrary sequences of data symbols, each sequence being modulated on a single sub-carrier of an orthogonal frequency division multiplexing (OFDM) signal, different sequences being modulated on different sub-carriers. These m modulated sub-carriers are orthogonal to one another, so that each of these modulated sub-carriers could be used as the complex envelope of one of the m excitations. For instance, orthogonality also exists between any two different resource elements of an OFDM signal (a resource element means one OFDM sub-carrier for the duration of one OFDM symbol), so that m different resource elements could each be used to obtain the complex envelope of one of the m excitations.

Fifth Embodiment

The fifth embodiment of a device of the invention, given by way of non-limiting example, also corresponds to the apparatus for radio communication shown in FIG. 3, and all explanations provided for the first embodiment and for the third embodiment are applicable to this fifth embodiment. Additionally, in this fifth embodiment, each of the complex envelopes of the m excitations is the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of the m complex envelopes being orthogonal to each of the secondary components of the m complex envelopes. More precisely, the primary components of the m complex envelopes are orthogonal to one another, for a given scalar product, and each of the primary components of the m complex envelopes is orthogonal to each of the secondary components of the m complex envelopes, for the given scalar product. Moreover, the scalar product of any one of the primary components of the m complex envelopes and itself is nonzero, so that the orthogonality requirements entail that the m complex envelopes are linearly independent.

Let us for instance consider the case in which the excitations are such that, while the one or more initial values are generated, for any integer a greater than or equal to 1 and less than or equal to m, the excitation number a consists of a current $i_a(t)$, of complex envelope $i_{Ea}(t)$, applied to the input port number a, the complex envelope $i_{Ea}(t)$ being of the form $$i_{Ea}(t) = i_{Ca}(t) + i_{Da}(t) \quad (14)$$

where $i_{Ca}(t)$ is the primary component of the complex envelope, and $i_{Da}(t)$ is the secondary component of the complex envelope, the primary components $i_{C1}(t), \ldots, i_{Cm}(t)$ of the m complex envelopes being orthogonal to each other, and each of the primary components $i_{C1}(t), \ldots, i_{Cm}(t)$ of the m complex envelopes being orthogonal to each of the secondary components $i_{D1}(t), \ldots, i_{Dm}(t)$ of the m complex envelopes. In this case, equation (9) is applicable, and the entries of $U_{UP}$ and of $J_{UP}$ can be easily computed, since, for any integer a greater than or equal to 1 and less than or equal to m, and for any integer b greater than or equal to 1 and less than or equal to m, the entry of the row b and the column a of $J_{UP}$, that is to say the b-th entry of the vector $j_{UPa}$, that is to say the a-th coordinate of the complex envelope $i_{UPb}(t)$ in the basis $i_{E1}(t), \ldots, i_{Em}(t)$, is clearly given by $$j_{ba} = \frac{\langle i_{Ca} | i_{UPb} \rangle}{\langle i_{Ca} | i_{Ca} \rangle} \quad (15)$$

and the entry of the row b and the column a of $U_{UP}$, that is to say the b-th entry of the vector $u_{UPa}$, that is to say the a-th coordinate of the complex envelope $v_{UPb}(t)$ in said basis, is clearly given by $$u_{ba} = \frac{\langle i_{Ca} | v_{UPb} \rangle}{\langle i_{Ca} | i_{Ca} \rangle} \quad (16)$$

For instance, let us assume that, for any integer b greater than or equal to 1 and less than or equal to m, the sensing unit number b delivers: a first sensing unit output signal proportional to the voltage across the input port number b; and a second sensing unit output signal proportional to the current flowing in this input port. In this case, the transmission and signal processing unit may for instance perform a down-conversion of all sensing unit output signals, followed by a conversion into digital signals using bandpass sampling, and by a digital quadrature demodulation, to obtain, for any integer b greater than or equal to 1 and less than or equal to m, four digital signals: the samples of the real part of $v_{UPb}(t)$; the samples of the imaginary part of $v_{UPb}(t)$; the samples of the real part of $i_{UPb}(t)$; and the samples of the imaginary part of $i_{UPb}(t)$. These digital signals may then be further processed, based on equations (15) and (16), to estimate all entries of $U_{UP}$ and of $J_{UP}$.

We have just considered, as an example, the case in which the excitations are such that, while the one or more initial values are generated, for any integer a greater than or equal to 1 and less than or equal to m, the excitation number a consists of a current $i_a(t)$, of complex envelope $i_{Ea}(t)$, applied to the input port number a, the complex envelope $i_{Ea}(t)$ being the sum of $i_{Ca}(t)$ and $i_{Da}(t)$, where $i_{Ca}(t)$ is the primary component of the complex envelope, and $i_{Da}(t)$ is the secondary component of the complex envelope, the primary components $i_{C1}(t), \ldots, i_{Cm}(t)$ of the m complex envelopes being orthogonal to each other, each of the primary components $i_{C1}(t), \ldots, i_{Cm}(t)$ of the m complex envelopes being orthogonal to each of the secondary components $i_{D1}(t), \ldots, i_{Dm}(t)$ of the m complex envelopes. We have shown that, in this case, the effects of the different excitations can be easily identified, as if the different excitations had been applied successively to the input ports, so that the m excitations can be used to estimate an impedance matrix presented by the input ports, and any quantity depending on said impedance matrix presented by the input ports, said impedance matrix presented by the input ports being an impedance matrix presented by the input ports while the one or more initial values are generated. Alternatively, the excitations could for instance be such that, while the one or more initial values are generated, for any integer a greater than or equal to 1 and less than or equal to m, the excitation number a consists of a voltage $v_a(t)$, of complex envelope $v_{Ea}(t)$, applied to the input port number a, the complex envelope $v_{Ea}(t)$ being the sum of $v_{Ca}(t)$ and $v_{Da}(t)$, where $v_{Ca}(t)$ is the primary component of the complex envelope, and $v_{Da}(t)$ is the secondary component of the complex envelope, the primary components $v_{C1}(t), \ldots, v_{Cm}(t)$ of the m complex envelopes being orthogonal to each other, each of the primary components $v_{C1}(t), \ldots, v_{Cm}(t)$ of the m complex envelopes being orthogonal to each of the secondary components $v_{D1}(t), \ldots, v_{Dm}(t)$ of the m complex envelopes. In this case, using a proof similar to the one presented above for applied currents, we can show that the effects of the different excitations can be easily identified, as if the different excitations had been applied successively to the input ports, so that the m excitations can be used to estimate an impedance matrix presented by the input ports, and any quantity depending on said impedance matrix presented by the input ports, said impedance matrix presented by the input ports being an impedance matrix presented by the input ports while the one or more initial values are generated.

We observe that the type of excitations used in the fourth embodiment is a special case of the more general type of excitations used in this fifth embodiment, since excitations used in this fifth embodiment and having zero secondary components can be used in the fourth embodiment.

The specialist understands how to generate m excitations having complex envelopes, each of said complex envelopes being the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of the m complex envelopes being orthogonal to each of the secondary components of the m complex envelopes. For instance, let us consider m arbitrary sequences of data symbols, each sequence being modulated on a single sub-carrier of an OFDM signal, different sequences being modulated on different sub-carriers. The sub-carriers modulated by the m arbitrary sequences are orthogonal to one another, and each of them is orthogonal to any combination of sub-carriers which are not modulated by any one of the m arbitrary sequences, and which may carry any data. Thus, each of the sub-carriers modulated by the m arbitrary sequences could be used as the primary component of the complex envelope of one of the m excitations, and any combination of sub-carriers which are not modulated by any one of the m arbitrary sequences, and which may carry any data, could be used as the secondary component of the complex envelope of any one of the m excitations. For instance, let us consider m different resource elements of an OFDM signal. The m different resource elements are orthogonal to one another, and each of the m different resource elements is orthogonal to any combination of resource elements which are not one of said m different resource elements. Thus, each of said m different resource elements could be used to obtain the primary component of the complex envelope of one of the m excitations, and any combination of resource elements which are not one of said m different resource elements could be used to obtain the secondary component of the complex envelope of any one of the m excitations.

We observe that, in typical 4G standards applicable to MIMO wireless networks, OFDM or single carrier frequency domain equalization (SC-FDE) is used for transmission, and different resource elements in different spatial layers (also referred to as "spatial streams") are used to provide reference signals (also referred to as "pilots") for MIMO channel estimation. Such a reference signal, considered in a given spatial layer, can be used as the primary component of the complex envelope of one of the m excitations, and any combination of resource elements which are not used by such a reference signal, considered in a given spatial layer and carrying any data symbols, can be used to obtain the secondary component of the complex envelope of any one of the m excitations. This is because the reference signals meet suitable orthogonality relations. Consequently, this fifth embodiment is compatible with the requirements of 4G standards typically applicable to MIMO wireless networks.

Sixth Embodiment (Best Mode)

Figure 4:
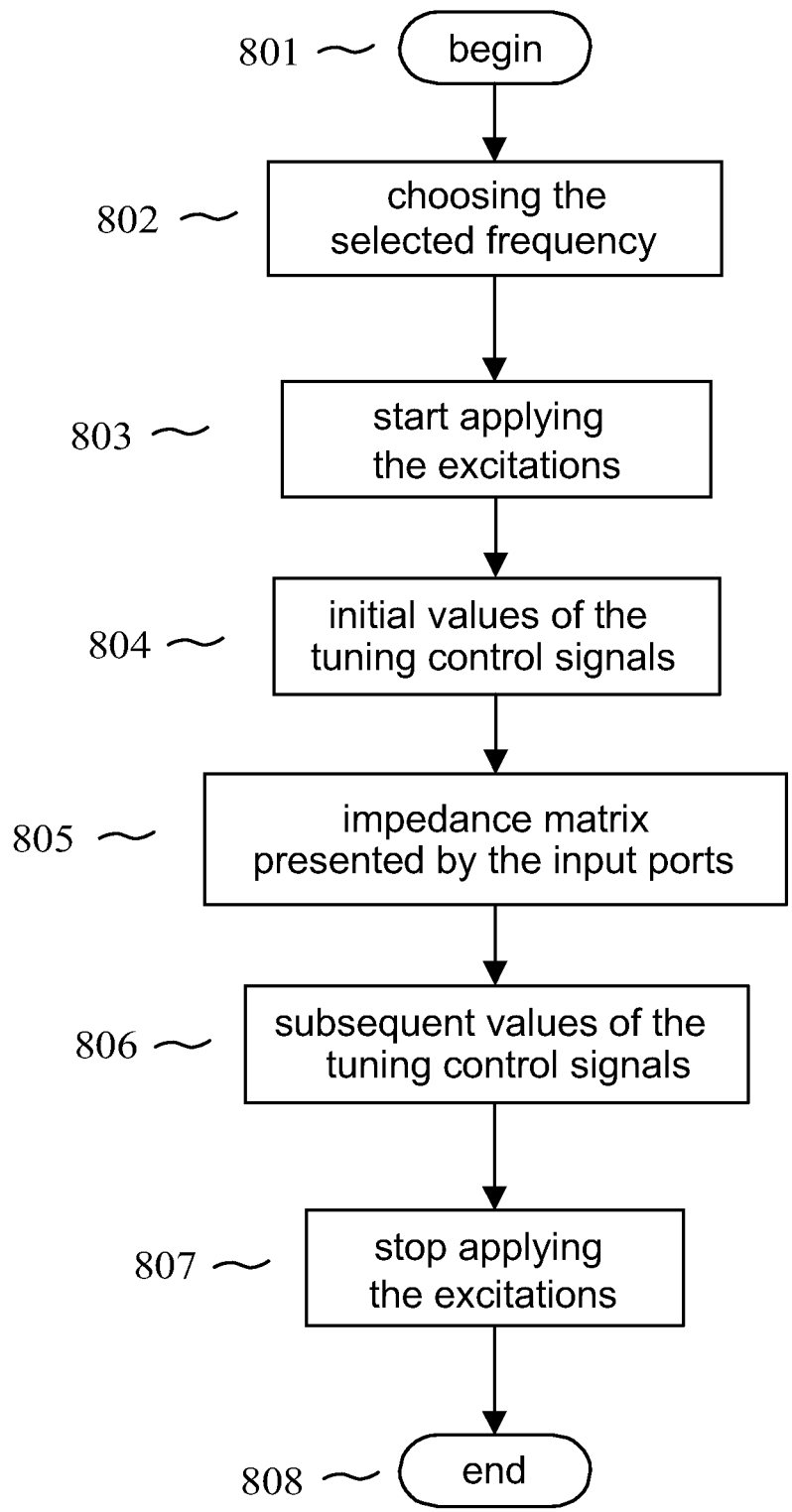
FIG. 4 shows a flowchart implemented in an apparatus for radio communication of the invention (sixth embodiment)

The sixth embodiment of a device of the invention, given by way of non-limiting example and best mode of carrying out the invention, also corresponds to the apparatus for radio communication shown in FIG. 3, and all explanations provided for the first embodiment are applicable to this sixth embodiment. A flowchart of one of the one or more adjustment sequences used in this sixth embodiment is shown in FIG. 4. In addition to the begin symbol (801) and the end symbol (808), said flowchart comprises:

a process "choosing the selected frequency" (802), in which the transmission and signal processing unit chooses the selected frequency, from the set of possible values of the selected frequency;

a process "start applying the excitations" (803), in which the transmission and signal processing unit starts applying at least one of the excitations, each of the excitations having a carrier frequency which is equal to the selected frequency, so that the sensing units become able to deliver sensing unit output signals such that each of the sensing unit output signals is determined by an electrical variable sensed at one of the input ports while at least one of the excitations is applied;

a process "initial values of the tuning control signals" (804), in which the transmission and signal processing unit delivers an initial tuning unit adjustment instruction, and in which, for each of the one or more tuning control signals, the control unit generates a value of said each of the one or more tuning control signals, said value being referred to as initial value, said initial value being determined as a function of the initial tuning unit adjustment instruction, and only as a function of the initial tuning unit adjustment instruction;

a process "impedance matrix presented by the input ports" (805), in which the transmission and signal processing unit estimates q=2m² tuning parameters, which fully determine an impedance matrix presented by the input ports, said impedance matrix presented by the input ports being an impedance matrix presented by the input ports while each said initial value is generated, for instance as explained in the fifth embodiment;

a process "subsequent values of the tuning control signals" (806), in which the transmission and signal processing unit delivers a subsequent tuning unit adjustment instruction, and in which, for each of the one or more tuning control signals, the control unit generates a value of said each of the one or more tuning control signals, said value being referred to as subsequent value, said subsequent value being determined as a function of said subsequent tuning unit adjustment instruction, and only as a function of said subsequent tuning unit adjustment instruction; and a process "stop applying the excitations" (807), in which the transmission and signal processing unit stops applying each said at least one of the excitations.

Said one of the one or more adjustment sequences is intended to be such that, at the end of said one of the one or more adjustment sequences, the impedance matrix presented by the input ports is close to a wanted impedance matrix, denoted by $Z_W$, said wanted impedance matrix being possibly dependent on the selected frequency.

Let us consider a norm of the image of an impedance matrix denoted by Z, under a matrix function denoted by h, the matrix function being a function from a set of square complex matrices into the same set of square complex matrices, the matrix function being continuous where it is defined and such that $h(Z_W)$ is a null matrix. For instance, the norm may be a vector norm or a matrix norm. For instance, the matrix function may be defined by $$h(Z)=Z-Z_W \tag{17}$$

in which case the image of Z under the matrix function is a difference of impedance matrices, or by $$h(Z)=Z^{-1}Z_W^{-1} \tag{18}$$

in which case the image of Z under the matrix function is a difference of admittance matrices, or by $$h(Z)=(Z-Z_W)(Z+Z_W)^{-1} \tag{19}$$

in which case the image of Z under the matrix function is a matrix of voltage reflection coefficients. In the context of this embodiment, we say that the impedance matrix Z is close to the wanted impedance matrix, if and only if said norm of h(Z) is close to zero; we say that the impedance matrix Z is coarsely close to the wanted impedance matrix, if and only if said norm of h(Z) is coarsely close to zero; we say that the impedance matrix Z is as close as possible to the wanted impedance matrix, if and only if said norm of h(Z) is as close as possible to zero; we say that the impedance matrix Z is very close to the wanted impedance matrix, if and only if said norm of h(Z) is very close to zero; etc.

In the process "initial values of the tuning control signals" (804), the initial tuning unit adjustment instruction is determined as a function of the selected frequency.

For instance, in the process "initial values of the tuning control signals" (804), it is possible that the transmission and signal processing unit uses a lookup table (also spelled "look-up table") to determine and deliver the initial tuning unit adjustment instruction, as a function of the selected frequency. The specialist knows how to build and use such a lookup table, and he understands that such a lookup table cannot take into account the variations of $Z_{Sant}$ caused by variations in the electromagnetic characteristics of the volume surrounding the antennas. Consequently, in this case, at the end of the process "initial values of the tuning control signals" (804), it is very likely that the impedance matrix presented by the input ports is only very coarsely close to the wanted impedance matrix $Z_W$.

For instance, in the process "initial values of the tuning control signals" (804), it is possible that the transmission and signal processing unit first determines if an earlier adjustment sequence (that is to say, an adjustment sequence which was completed before the beginning of said one of the one or more adjustment sequences), which used the same selected frequency as said one of the one or more adjustment sequences, has its subsequent tuning unit adjustment instruction stored in memory, in which case this subsequent tuning unit adjustment instruction stored in memory is used to determine and deliver the initial tuning unit adjustment instruction, whereas, in the opposite case, a lookup table is used to determine and deliver the initial tuning unit adjustment instruction, as a function of the selected frequency (as explained above). The specialist understands that a subsequent tuning unit adjustment instruction of an earlier adjustment sequence cannot take into account the current variations of $Z_{Sant}$ caused by variations in the electromagnetic characteristics of the volume surrounding the antennas, so that, at the end of the process "initial values of the tuning control signals" (804), it is likely that the impedance matrix presented by the input ports is only coarsely close to the wanted impedance matrix $Z_W$.

We are now going to explain how, by utilizing a numerical model, the process "subsequent values of the tuning control signals" (806) provides an impedance matrix presented by the input ports, denoted by $Z_U$, which is very close, or as close as possible, to the wanted impedance matrix $Z_W$. Here, the numerical model is a model of the multiple-input-port and multiple-output-port tuning unit and of the control unit. The specialist understands that an accurate numerical model of the multiple-input-port and multiple-output-port tuning unit and of the control unit may be put in the form of a mapping denoted by $g_U$ and defined by $$g_U(f,Z_{Sant},t_C,a_T)=Z_U \tag{20}$$

where f is the frequency, where $t_C$ is the applicable tuning unit adjustment instruction, $t_C$ lying in a set of possible tuning unit adjustment instructions, this set being denoted by $T_C$, and where $a_T$ is a real vector of temperatures, which is sufficient to characterize the effects of temperature on $Z_U$. As an example, if the impedance of each of the adjustable impedance devices of the tuning unit depends on its temperature and if the characteristics of the control unit do not significantly depend on temperature, the elements of $a_T$ could for instance be the temperatures of the adjustable impedance devices of the tuning unit, or $a_T$ could for instance have a single element, this single element being a common temperature applicable to each of the adjustable impedance devices of the tuning unit, if such a common temperature exists.

We assume that the transmission and signal processing unit knows the mapping $g_U$, for instance based on one or more equations and/or on one or more suitable lookup tables. The process "subsequent values of the tuning control signals" (806) utilizes the q tuning parameters to determine a value of $Z_U$, said value of $Z_U$ being denoted by $Z_{UI}$ and being an impedance matrix presented by the input ports while the one or more initial values are generated. The process "subsequent values of the tuning control signals" (806) then utilizes the selected frequency (which is a quantity determined by the selected frequency), denoted by $f_C$, and the initial tuning unit adjustment instruction (which is a variable determined by the initial tuning unit adjustment instruction), denoted by $t_{CI}$, to solve the equation $$g_U(f_C, Z_{Sant}, t_{CI}, a_T) = Z_{UI} \quad (21)$$

with respect to the unknown $Z_{Sant}$. When this is done, $Z_{Sant}$ has been computed, and the process "subsequent values of the tuning control signals" (806) may use an algorithm to find a subsequent tuning unit adjustment instruction, denoted by $t_{CS}$, such that the impedance matrix presented by the input ports $Z_U$ given by $$g_U(f_C, Z_{Sant}, t_{CS}, a_T) = Z_U \quad (22)$$

is very close, or as close as possible, to the wanted impedance matrix $Z_W$.

Said one of the one or more adjustment sequences uses the model of the multiple-input-port and multiple-output-port tuning unit and of the control unit twice, the first time when it uses equation (21) and the second time when it uses equation (22). The explanations provided below in the presentations of the thirteenth and fourteenth embodiments show that this characteristic is such that the inaccuracies in the model of the multiple-input-port and multiple-output-port tuning unit and of the control unit have a reduced effect on the accuracy of the resulting $Z_U$. Thus, said one of the one or more adjustment sequences is accurate.

We see that, according to our explanations, the transmission and signal processing unit can determine a subsequent tuning unit adjustment instruction such that $Z_U$ is very close, or as close as possible, to $Z_W$, by utilizing a numerical model of the multiple-input-port and multiple-output-port tuning unit and of the control unit, and as a function of:

(a) one or more quantities determined by the selected frequency;

(b) one or more variables determined by one or more of the one or more initial tuning unit adjustment instructions; and (c) the q tuning parameters.

The specialist understands that, to compensate the effects of temperature, the subsequent tuning unit adjustment instruction (and, consequently, the subsequent values of the one or more tuning control signals) may also be determined as a function of:

(d) one or more temperature signals each mainly determined by one or more temperatures measured at one or more locations in the multiple-input-port and multiple-output-port tuning unit; and/or (e) one or more temperature signals each mainly determined by one or more temperatures measured at one or more locations in the control unit.

The specialist understands that the possible use of the data (d) and (e) is for instance relevant if the impedance of at least one of the adjustable impedance devices of the tuning unit significantly depends on its temperature and/or if the characteristics of the control unit significantly depend on temperature.

The specialist understands that, in the steps of the process "subsequent values of the tuning control signals" (806), the combined use of the data (a), (b) and (c), and possibly of the data (d) and (e), has allowed the transmission and signal processing unit to compute $Z_{Sant}$ by utilizing equation (21), and to determine afterwards the subsequent tuning unit adjustment instruction by utilizing an algorithm based on equation (22), so that each of the one or more tuning control signals can directly vary from its initial value to its subsequent value, the subsequent values of the one or more tuning control signals being such that $Z_U$ is very close, or as close as possible, to $Z_W$. Thus, said one of the one or more adjustment sequences is very fast.

Consequently, we see that the invention overcomes the limitations of prior art, because it provides a fast and accurate method for automatically tuning an impedance matrix.

The specialist understands that the invention is completely different from the first and second methods for automatically tuning an impedance matrix mentioned above in the "prior art" section, because the invention is characterized in that at least one subsequent tuning unit adjustment instruction is determined as a function of the data (a), (b) and (c), which allows the transmission and signal processing unit to utilize a numerical model of the multiple-input-port and multiple-output-port tuning unit and of the control unit twice, to obtain a fast and accurate method for automatically tuning an impedance matrix. The specialist understands that the invention is completely different from the third method for automatically tuning an impedance matrix mentioned above in the "prior art" section, because the invention is not based on the use of electrical variables sensed at the output ports.

Seventh Embodiment

The seventh embodiment of a device of the invention, given by way of non-limiting example, also corresponds to the apparatus for radio communication shown in FIG. 3 and to the flowchart shown in FIG. 4, and all explanations provided for the first embodiment and for the sixth embodiment are applicable to this seventh embodiment.

Figure 5:
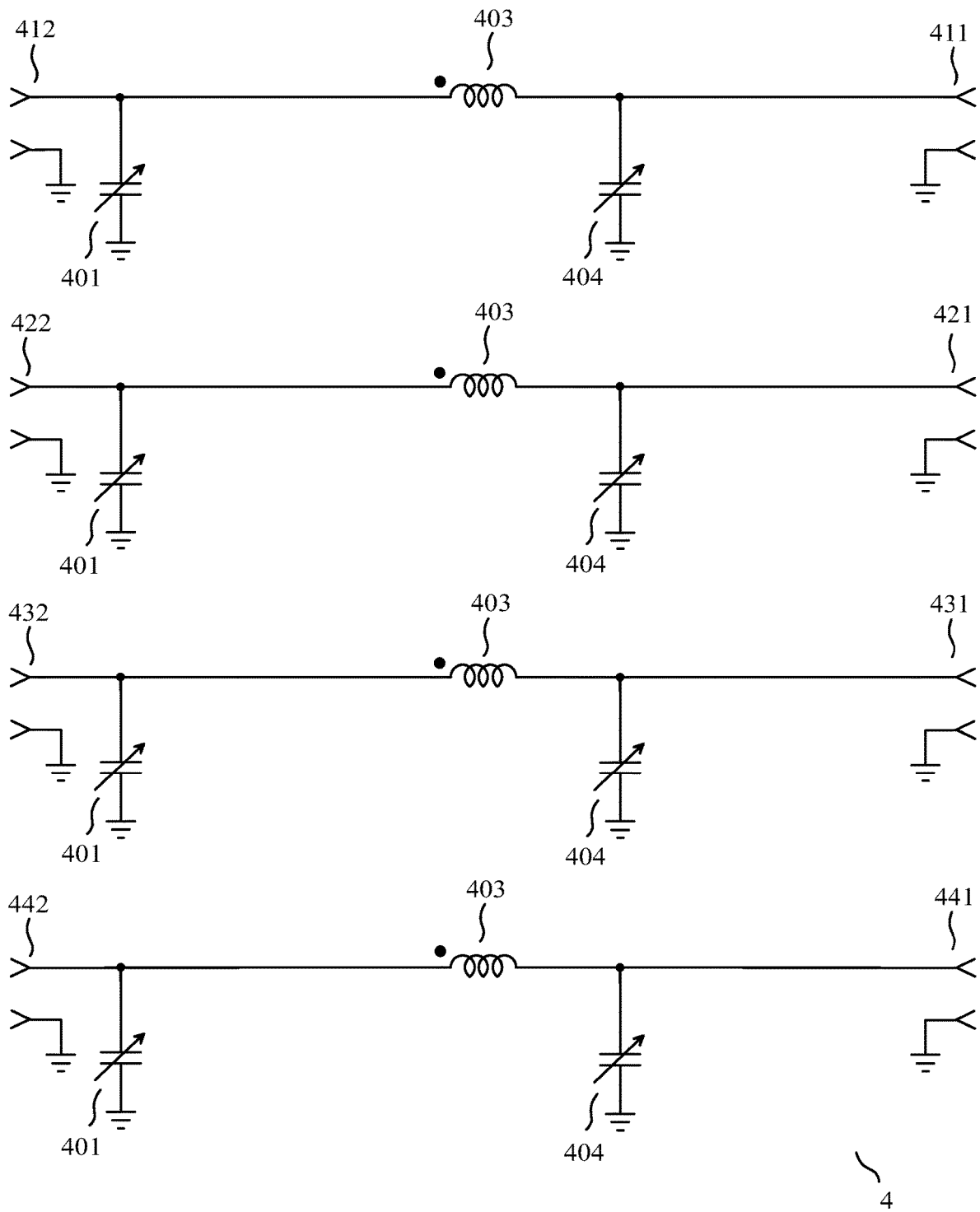
FIG. 5 shows a schematic diagram of a multiple-input-port and multiple-output-port tuning unit having 4 input ports and 4 output ports, which may be used in the apparatus for radio communication shown in FIG. 3 (seventh embodiment)

We have represented in FIG. 5 the multiple-input-port and multiple-output-port tuning unit (4) used in this seventh embodiment. This multiple-input-port and multiple-output-port tuning unit comprises:

n=4 output ports (412) (422) (432) (442);

m=4 input ports (411) (421) (431) (441);

n adjustable impedance devices of the tuning unit (401) each presenting a negative reactance and each being coupled in parallel with one of the output ports;

n=m windings (403) each having a first terminal coupled to one of the output ports and a second terminal coupled to one of the input ports; and m adjustable impedance devices of the tuning unit (404) each presenting a negative reactance and each being coupled in parallel with one of the input ports.

All adjustable impedance devices of the tuning unit (401) (404) are adjustable by electrical means, but the circuits and the control links needed to determine the reactance of each of the adjustable impedance devices of the tuning unit are not shown in FIG. 5. In this seventh embodiment, we use p=2m=8 adjustable impedance devices of the tuning unit.

It is possible that mutual induction exists between the windings (403). In this case, the inductance matrix of the windings is not a diagonal matrix.

If no mutual induction exists between the windings, we see that the multiple-input-port and multiple-output-port tuning unit shown in FIG. 5 is composed of n=m singleinput-port and single-output-port tuning units, each comprising one or more of the adjustable impedance devices of the tuning unit, or two or more of the adjustable impedance devices of the tuning unit, these single-input-port and single-output-port tuning units being independent and uncoupled. Such a multiple-input-port and multiple-output-port tuning unit is for instance considered in the section III of the article of F. Broydé and E. Clavelier entitled "Two Multiple-Antenna-Port and Multiple-User-Port Antenna Tuners", published in *Proc. 9th European Conference on Antenna and Propagation, EuCAP* 2015, in April 2015.

The specialist understands that the multiple-input-port and multiple-output-port tuning unit is such that, at the given frequency, there exists a diagonal impedance matrix referred to as "the given diagonal impedance matrix", the given diagonal impedance matrix being such that, if an impedance matrix seen by the output ports is equal to the given diagonal impedance matrix, then the reactance of any one of the adjustable impedance devices of the tuning unit has an influence on the impedance matrix presented by the input ports.

The specialist understands that, since p=2m=8, the multiple-input-port and multiple-output-port tuning unit cannot have a full tuning capability, the definition of which is given in section III of said article entitled "Some Properties of Multiple-Antenna-Port and Multiple-User-Port Antenna Tuners". Consequently, if a subsequent tuning unit adjustment instruction $t_{CS}$ is such that $Z_U$ given by equation (22) is as close as possible to $Z_W$, then the subsequent tuning unit adjustment instruction $t_{CS}$ need not be such that $Z_U$ given by equation (22) is very close to $Z_W$.

The specialist understands that we may use:

$Y_{401}(f_C, t_C, a_T)$ to denote an admittance matrix of the n adjustable impedance devices of the tuning unit (401) each presenting a negative reactance and each being coupled in parallel with one of the output ports;

$Z_{403}(f_C, a_T)$ to denote an impedance matrix of the n=m windings (403) each having a first terminal coupled to one of the output ports and a second terminal coupled to one of the input ports; and $Y_{404}(f_C, t_C, a_T)$ to denote an admittance matrix of the m adjustable impedance devices of the tuning unit (404) each presenting a negative reactance and each being coupled in parallel with one of the input ports.

The specialist understands that we obtain $$g_U(f, Z_{Sant}, t_C, a_T) = (((Z_{Sant}^{-1} + Y_{401}(f_C, t^C, a_T))^{-1} + Z_{403}(f_C, a_T))^{-1} + Y_{404}(f_C, t_C, a_T))^{-1} \quad (23)$$

The transmission and signal processing unit knows said numerical model, which comprises equation (23) relating to the mapping $g_U$, a lookup table describing $Y_{401}(f_C, t_C, a_T)$, a lookup table describing $Z_{403}(f_C, a_T)$ and a lookup table describing $Y_{404}(f_C, t_C, a_T)$. Thus, the solution of equation (21) with respect to the unknown $Z_{Sant}$ is given by $$Z_{Sant} = (((Z_{UT}^{-1} - Y_{404}(f_C, t_{CI}, a_T))^{-1} - Z_{403}(f_C, a_T))^{-1} - Y_{401}(f_C, t_{CI}, a_T))^{-1} \quad (24)$$

so that it is computed quickly and accurately by the transmission and signal processing unit. We note that such a computation does not exist in any of the methods for automatically tuning an impedance matrix mentioned above in the "prior art" section.

Eighth Embodiment

The eighth embodiment of a device of the invention, given by way of non-limiting example, also corresponds to the apparatus for radio communication shown in FIG. 3 and to the flowchart shown in FIG. 4, and all explanations provided for the first embodiment and for the sixth embodiment are applicable to this eighth embodiment.

Figure 6:
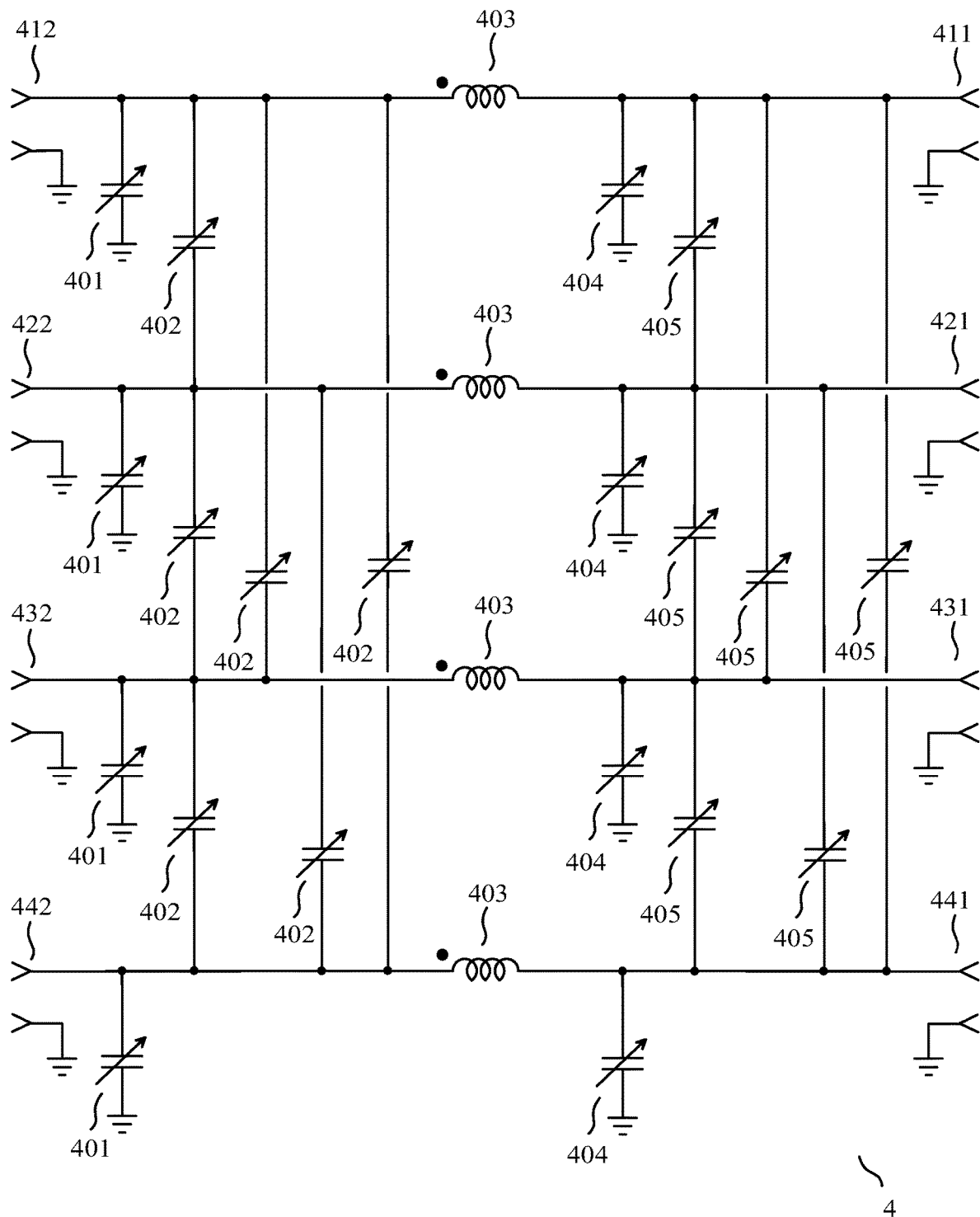
FIG. 6 shows a schematic diagram of a multiple-input-port and multiple-output-port tuning unit having 4 input ports and 4 output ports, which may be used in the apparatus for radio communication shown in FIG. 3 (eighth embodiment)

We have represented in FIG. 6 the multiple-input-port and multiple-output-port tuning unit (4) used in this eighth embodiment. This multiple-input-port and multiple-output-port tuning unit comprises:

n=4 output ports (412) (422) (432) (442);

m=4 input ports (411) (421) (431) (441);

n adjustable impedance devices of the tuning unit (401) each presenting a negative reactance and each being coupled in parallel with one of the output ports;

n (n−1)/2 adjustable impedance devices of the tuning unit (402) each presenting a negative reactance and each having a first terminal coupled to one of the output ports and a second terminal coupled to one of the output ports which is different from the output port to which the first terminal is coupled;

n=m windings (403) each having a first terminal coupled to one of the output ports and a second terminal coupled to one of the input ports;

m adjustable impedance devices of the tuning unit (404) each presenting a negative reactance and each being coupled in parallel with one of the input ports; and m (m−1)/2 adjustable impedance devices of the tuning unit (405) each presenting a negative reactance and each having a first terminal coupled to one of the input ports and a second terminal coupled to one of the input ports which is different from the input port to which the first terminal is coupled.

All adjustable impedance devices of the tuning unit (401) (402) (404) (405) are adjustable by electrical means, but the circuits and the control links needed to control the reactance of each of the adjustable impedance devices of the tuning unit are not shown in FIG. 6. In this eighth embodiment, we have n=m and we use p=m (m+1)=20 adjustable impedance devices of the tuning unit.

It is possible that mutual induction exists between the windings (403). In this case, the inductance matrix of the windings is not a diagonal matrix.

The specialist knows that the characteristics of the multiple-input-port and multiple-output-port tuning unit shown in FIG. 6 have been investigated in: the article of F. Broydé and E. Clavelier, entitled "A New Multiple-Antenna-Port and Multiple-User-Port Antenna Tuner", published in *Proc. 2015 IEEE Radio & Wireless Week, RWW* 2015, at the pages 41 to 43, in January 2015; said article entitled "Some Properties of Multiple-Antenna-Port and Multiple-User-Port Antenna Tuners"; said article entitled "Two Multiple-Antenna-Port and Multiple-User-Port Antenna Tuners"; and in the article of F. Broydé and E. Clavelier entitled "A Tuning Computation Technique for a Multiple-Antenna-Port and Multiple-User-Port Antenna Tuner", published in *International Journal of Antennas and Propagation*, in 2016.

The specialist understands that the multiple-input-port and multiple-output-port tuning unit is such that, at the given frequency, there exists a diagonal impedance matrix referred to as "the given diagonal impedance matrix", the given diagonal impedance matrix being such that, if an impedance matrix seen by the output ports is equal to the given diagonal impedance matrix, then: the reactance of any one of the adjustable impedance devices of the tuning unit has an influence on the impedance matrix presented by the input ports; and the reactance of at least one of the adjustable impedance devices of the tuning unit has an influence on at least one non-diagonal entry of the impedance matrix presented by the input ports.

The specialist understands that, as explained in section VI of said article entitled "Some Properties of Multiple-Antenna-Port and Multiple-User-Port Antenna Tuners", the multiple-input-port and multiple-output-port tuning unit has a full tuning capability. Here, if a subsequent tuning unit adjustment instruction $t_{CS}$ is such that $Z_U$ given by equation (22) is as close as possible to $Z_W$, then the subsequent tuning unit adjustment instruction $t_{CS}$ is also such that $Z_U$ given by equation (22) is very close to $Z_W$.

The specialist understands that we may use:
- $Y_{401}(f_C, t_C, a_T)$ to denote an admittance matrix of the n (n+1)/2 adjustable impedance devices of the tuning unit (401) (402) each presenting a negative reactance and each being coupled to one or more of the output ports;
- $Z_{403}(f_C, a_T)$ to denote an impedance matrix of the n=m windings (403) each having a first terminal coupled to one of the output ports and a second terminal coupled to one of the input ports; and
- $Y_{404}(f_C, t_C, a_T)$ to denote an admittance matrix of the m (m+1)/2 adjustable impedance devices of the tuning unit (404) (405) each presenting a negative reactance and each being coupled to one or more of the input ports.

The specialist understands that equation (23) is applicable. The transmission and signal processing unit knows said numerical model, which comprises equation (23) relating to the mapping $g_U$, a lookup table describing $Y_{401}(f_C, t_C, a_T)$, a lookup table describing $Z_{403}(f_C, a_T)$ and a lookup table describing $Y_{404}(f_C, t_C, a_T)$. Thus, the solution of equation (21) with respect to the unknown $Z_{Sant}$ is given by equation (24), so that it is computed quickly and accurately by the transmission and signal processing unit. We note that such a computation does not exist in any of the methods for automatically tuning an impedance matrix mentioned above in the "prior art" section.

To find a subsequent tuning unit adjustment instruction $t_{CS}$ such that the impedance matrix presented by the input ports $Z_U$ given by equation (22) is as close as possible to the wanted impedance matrix $Z_W$ (in which case $Z_U$ is very close to $Z_W$, as explained above), the transmission and signal processing unit uses an algorithm. A first possible algorithm may for instance use the formulas shown in Section VI of said article entitled "Some Properties of Multiple-Antenna-Port and Multiple-User-Port Antenna Tuners". This first possible algorithm does not take the losses in the multiple-input-port and multiple-output-port tuning unit into account. A second possible algorithm may for instance use the iterative computation technique presented in Section 4 of said article entitled "A Tuning Computation Technique for a Multiple-Antenna-Port and Multiple-User-Port Antenna Tuner". This second possible algorithm is more accurate than the first possible algorithm, because it takes the losses in the multiple-input-port and multiple-output-port tuning unit into account. The specialist knows how to write such an algorithm, which uses said lookup tables. We see that the algorithm can be such that the adjustment of the multiple-input-port and multiple-output-port tuning unit is always optimal or almost optimal, in spite of the losses in the multiple-input-port and multiple-output-port tuning unit.

Ninth Embodiment

Figure 7:
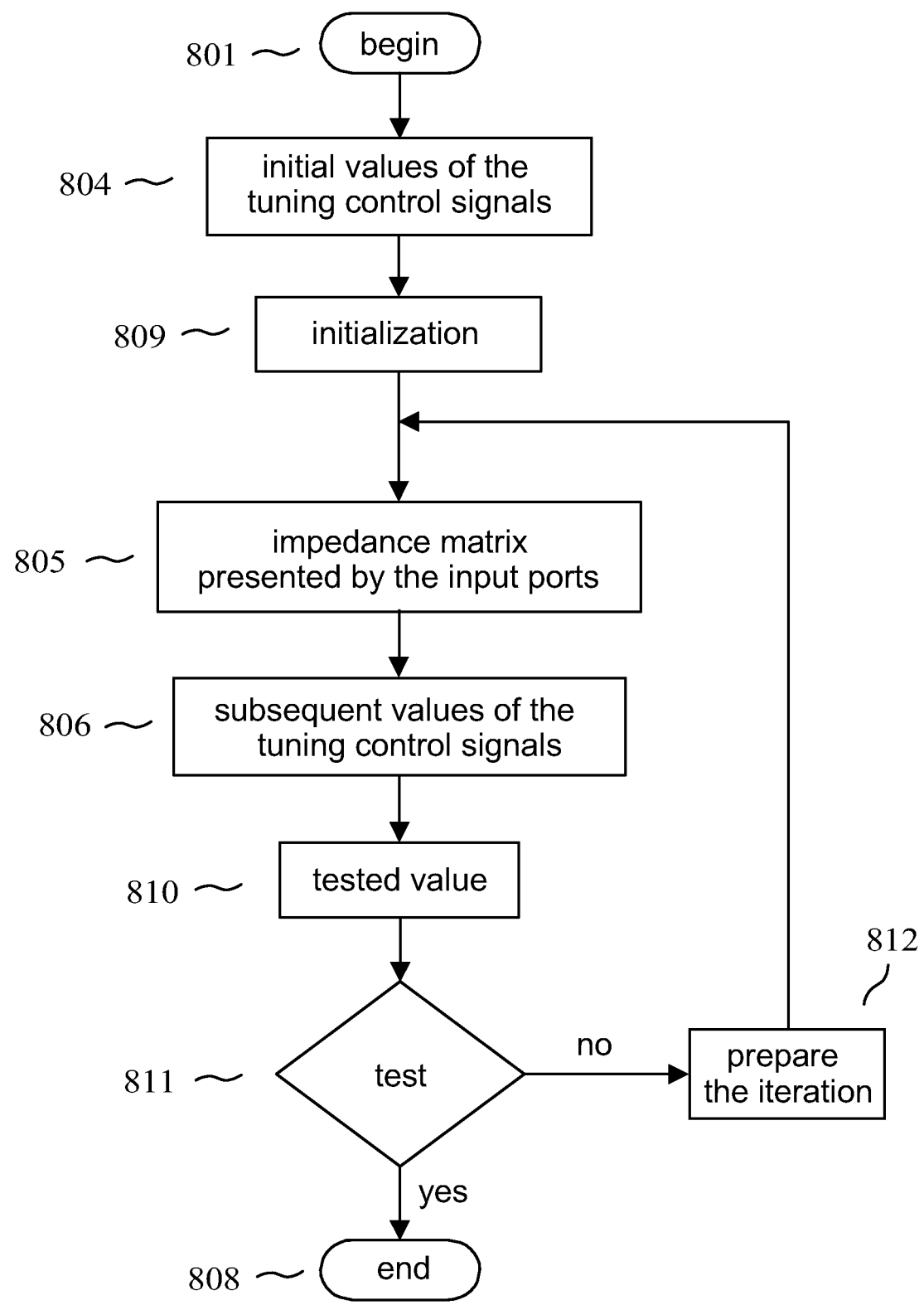
FIG. 7 shows a flowchart implemented in an apparatus for radio communication of the invention (ninth embodiment)

The ninth embodiment of a device of the invention, given by way of non-limiting example, also corresponds to the apparatus for radio communication shown in FIG. 3, and all explanations provided for the first embodiment are applicable to this ninth embodiment. In this ninth embodiment, the excitations are applied continuously, so that the sensing units can continuously deliver the sensing unit output signals caused by said excitations. A flowchart of one of the one or more adjustment sequences used in this ninth embodiment is shown in FIG. 7. Before said one of the one or more adjustment sequences, the transmission and signal processing unit has chosen the selected frequency, from the set of possible values of the selected frequency. Each of the excitations has, during said one of the one or more adjustment sequences, a carrier frequency which is equal to the selected frequency. In addition to the begin symbol (801) and the end symbol (808), said flowchart comprises:

- a process "initial values of the tuning control signals" (804), in which the transmission and signal processing unit delivers an initial tuning unit adjustment instruction, and in which, for each of the one or more tuning control signals, the control unit generates a value of said each of the one or more tuning control signals, said value being referred to as initial value, said initial value being determined as a function of the initial tuning unit adjustment instruction, and only as a function of the initial tuning unit adjustment instruction;
- a process "initialization" (809), in which a requirement is defined;
- a process "impedance matrix presented by the input ports" (805), in which the transmission and signal processing unit estimates $q=2m^2$ tuning parameters, which fully determine an impedance matrix presented by the input ports, said impedance matrix presented by the input ports being an impedance matrix presented by the input ports while the one of more initial values are generated;
- a process "subsequent values of the tuning control signals" (806), in which the transmission and signal processing unit delivers a subsequent tuning unit adjustment instruction by utilizing a numerical model, and in which, for each of the one or more tuning control signals, the control unit generates a value of said each of the one or more tuning control signals, said value being referred to as subsequent value, said subsequent value being determined as a function of said subsequent tuning unit adjustment instruction, and only as a function of said subsequent tuning unit adjustment instruction;
- a process (810) in which a test value is determined;
- a decision (811) used to reach the end symbol (808) if the test value satisfies the requirement (which corresponds to a termination criterion); and
- a process "prepare the iteration" (812), in which the transmission and signal processing unit decides that the latest subsequent tuning unit adjustment instruction becomes, for the next processes, the initial tuning unit adjustment instruction, and decides that, for each of the one or more tuning control signals, the subsequent value of said each of the one or more tuning control signals, which was determined as a function of said latest subsequent tuning unit adjustment instruction, becomes, for the next processes, the initial value of said each of the one or more tuning control signals.

The decision (811) is such that, during said one of the one or more adjustment sequences, the process "impedance matrix presented by the input ports" (805) and the process "subsequent values of the tuning control signals" (806) are performed at least two times, for instance two times, or for instance three times.

The explanations provided below in the presentations of the thirteenth, fifteenth and sixteenth embodiments show that, in the case where the numerical model is not accurate, and in the case where the effects of temperature are significant and not accurately compensated, said one of the one or more adjustment sequences is accurate, because the process "impedance matrix presented by the input ports" (805) and the process "subsequent values of the tuning control signals" (806) are performed at least two times.

Tenth Embodiment

Figure 8:
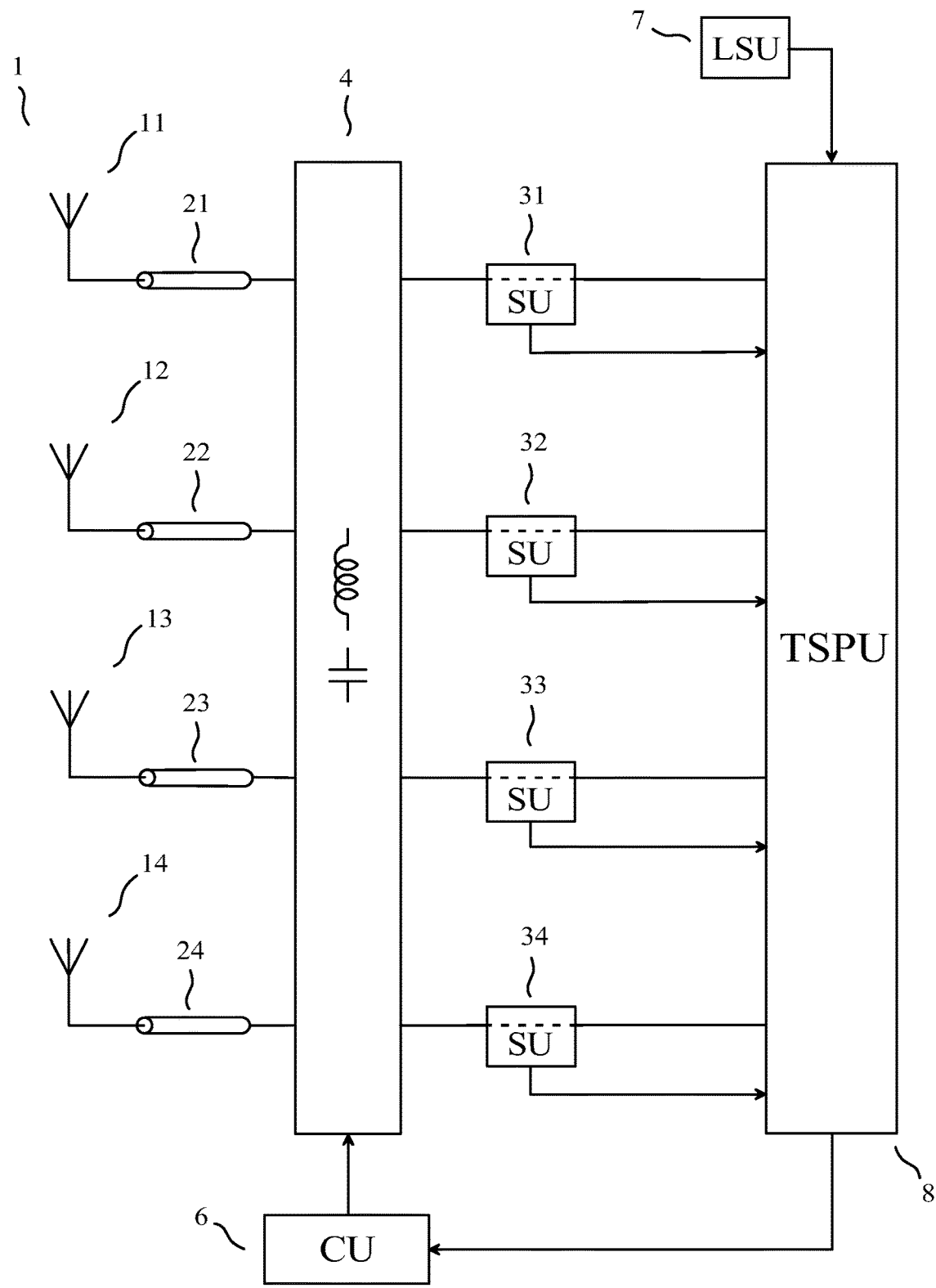
FIG. 8 shows a block diagram of an apparatus for radio communication of the invention (tenth embodiment)

As a tenth embodiment of the invention, given by way of non-limiting example, we have represented in FIG. 8 the block diagram of an apparatus for radio communication comprising:

a localization sensor unit (7), the localization sensor unit estimating one or more "localization variables", each of the one or more localization variables depending on a distance between a part of a human body and a zone of the apparatus for radio communication;

N=4 antennas (11) (12) (13) (14), the antennas forming a multiport antenna array (1);

N feeders (21) (22) (23) (24);

a multiple-input-port and multiple-output-port tuning unit (4) having m=4 input ports and n=N output ports, the multiple-input-port and multiple-output-port tuning unit comprising p adjustable impedance devices, where p is an integer greater than or equal to 2m=8, the p adjustable impedance devices being referred to as the "adjustable impedance devices of the tuning unit" and being such that, at a given frequency greater than or equal to 300 MHz, each of the adjustable impedance devices of the tuning unit has a reactance, the reactance of any one of the adjustable impedance devices of the tuning unit being adjustable by electrical means;

m sensing units (31) (32) (33) (34), each of the sensing units delivering two or more "sensing unit output signals", each of the sensing unit output signals being determined by an electrical variable sensed at one of the input ports;

a transmission and signal processing unit (8), the transmission and signal processing unit delivering "tuning unit adjustment instructions", at least one of the tuning unit adjustment instructions being an "initial tuning unit adjustment instruction", at least one of the tuning unit adjustment instructions being a "subsequent tuning unit adjustment instruction"; and a control unit (6), the control unit delivering one or more "tuning control signals", the control unit generating, for each of the one or more tuning control signals, one or more values of said each of the one or more tuning control signals, each of said one or more values of said each of the one or more tuning control signals being determined as a function of at least one of the tuning unit adjustment instructions, the reactance of each of the adjustable impedance devices of the tuning unit being mainly determined by one or more values of at least one of the one or more tuning control signals;

the apparatus for radio communication being characterized in that:

the transmission and signal processing unit selects a frequency referred to as the "selected frequency";

at least one of the one or more initial tuning unit adjustment instructions is determined as a function of one or more quantities depending on the selected frequency, and as a function of the one or more localization variables;

the transmission and signal processing unit applies, through the sensing units, m excitations to the m input ports, one and only one of the excitations being applied to each of the input ports, each of the excitations having a carrier frequency which is equal to the selected frequency;

for each of the one or more tuning control signals, said one or more values of said each of the one or more tuning control signals comprise an initial value determined as a function of one or more of the one or more initial tuning unit adjustment instructions;

the transmission and signal processing unit estimates q tuning parameters by utilizing the sensing unit output signals, where q is an integer greater than or equal to m, each of the tuning parameters being a real quantity depending on an impedance matrix presented by the input ports, said impedance matrix presented by the input ports being an impedance matrix presented by the input ports while each said initial value is generated; and at least one of the one or more subsequent tuning unit adjustment instructions is determined by utilizing a numerical model, as a function of:

one or more quantities depending on the selected frequency;

one or more variables depending on one or more of the one or more initial tuning unit adjustment instructions; and the q tuning parameters.

It is possible that at least one of the one or more localization variables is an output of a sensor responsive to a pressure exerted by a part of a human body. Thus, it is possible that at least one of the one or more localization variables is the output of a circuit comprising a switch using a single pressure non-locking mechanical system, the state of which changes while a sufficient pressure is exerted by a part of a human body. It is also possible that at least one of the one or more localization variables is the output of a circuit comprising another type of electromechanical sensor responsive to a pressure exerted by a part of a human body, for instance a microelectromechanical sensor (MEMS sensor).

It is possible that at least one of the one or more localization variables is an output of a proximity sensor, such as a proximity sensor dedicated to the detection of a human body. Such a proximity sensor may for instance be a capacitive proximity sensor, or an infrared proximity sensor using reflected light intensity measurements, or an infrared proximity sensor using time-of-flight measurements, which are well known to specialists.

It is possible that the set of the possible values of at least one of the one or more localization variables is a finite set. It is possible that at least one of the one or more localization variables is a binary variable, that is to say such that the set of the possible values of said at least one of the one or more localization variables has exactly two elements. For instance, a capacitive proximity sensor dedicated to the detection of a human body (for instance the device SX9300 of Semtech) can be used to obtain a binary variable, which indicates whether or not a human body has been detected near a zone of the apparatus for radio communication. It is possible that the set of the possible values of any one of the one or more localization variables is a finite set. However, it is possible that the set of the possible values of at least one of the one or more localization variables is an infinite set, and it is possible that the set of the possible values of at least one of the one or more localization variables is a continuous set.

It is possible that the set of the possible values of at least one of the one or more localization variables has at least three elements. For instance, an infrared proximity sensor using time-of-flight measurements and dedicated to the assessment of the distance to a human body (for instance the device VL6180 of STMicroelectronics) can be used to obtain a localization variable such that the set of the possible values of the localization variable has three or more elements, one of the values meaning that no human body has been detected, each of the other values corresponding to a different distance between a zone of the apparatus for radio communication and the nearest detected part of a human body. It is possible that the set of the possible values of any one of the one or more localization variables has at least three elements.

It is possible that at least one of the one or more localization variables is an output of a sensor which is not dedicated to human detection. For instance, it is possible that at least one of the one or more localization variables is determined by a change of state of a switch of a keypad or keyboard, which is indicative of the position of a human finger. For instance, it is possible that at least one of the one or more localization variables is determined by a change of state of an output of a touchscreen, which is indicative of the position of a human finger. Such a touchscreen may use any one of the available technologies, such as a resistive touchscreen, a capacitive touchscreen or a surface acoustic wave touchscreen, etc.

It is said above that each of the one or more localization variables depends on the distance between a part of a human body and a zone of the apparatus for radio communication. This must be interpreted as meaning: each of the one or more localization variables is such that there exists at least one configuration in which the distance between a part of a human body and a zone of the apparatus for radio communication has an effect on said each of the one or more localization variables. However, it is possible that there exist one or more configurations in which the distance between a part of a human body and a zone of the apparatus for radio communication has no effect on said each of the one or more localization variables. For instance, the distance between a part of a human body and a zone of the apparatus for radio communication has no effect on a switch, in a configuration in which no force is directly or indirectly exerted by the human body on the switch. For instance, the distance between a part of a human body and a zone of the apparatus for radio communication has no effect on a proximity sensor if the human body is out of the proximity sensor's range.

Eleventh Embodiment

The eleventh embodiment of a device of the invention, given by way of non-limiting example, also corresponds to the apparatus for radio communication shown in FIG. 8, and all explanations provided for the tenth embodiment are applicable to this eleventh embodiment. Moreover, in this eleventh embodiment, the apparatus for radio communication is a mobile phone, and the localization sensor unit comprises 4 proximity sensors.

Figure 9:
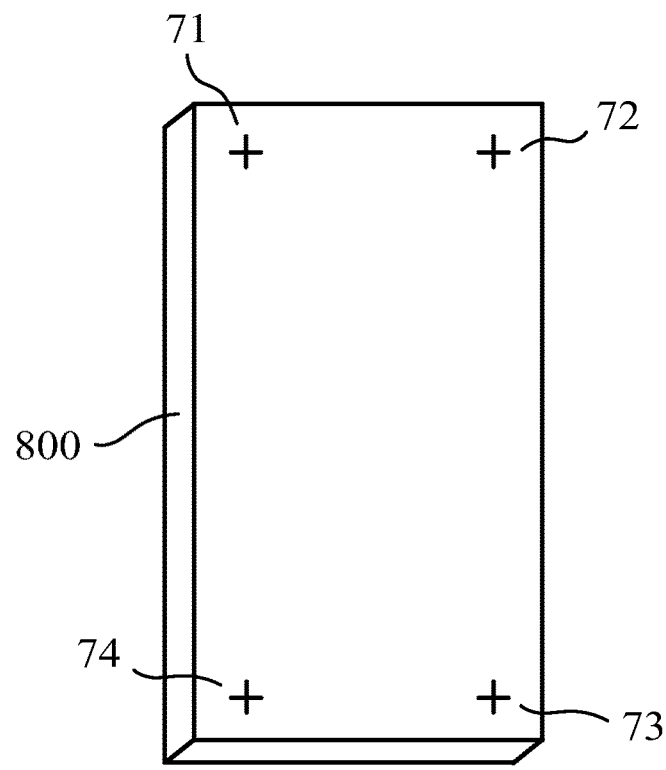
FIG. 9 shows the locations of the four antennas of a mobile phone (eleventh embodiment)

FIG. 9 is a drawing of a back view of the mobile phone (800). FIG. 9 shows: a point (71) where the first of the 4 proximity sensors is located (e.g., near one of the antennas (11) illustrated in FIG. 8); a point (72) where the second of the 4 proximity sensors is located (e.g., near one of the antennas (12) illustrated in FIG. 8); a point (73) where the third of the 4 proximity sensors is located (e.g., near one of the antennas (13) illustrated in FIG. 8); and a point (74) where the fourth of the 4 proximity sensors is located (e.g., near one of the antennas (14) illustrated in FIG. 8).

Figure 10:
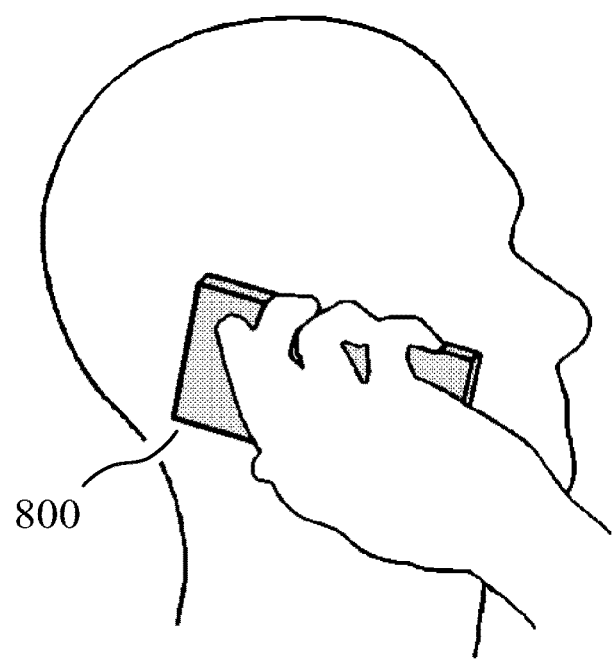
FIG. 10 shows a first typical use configuration (right hand and head configuration)
Figure 11:
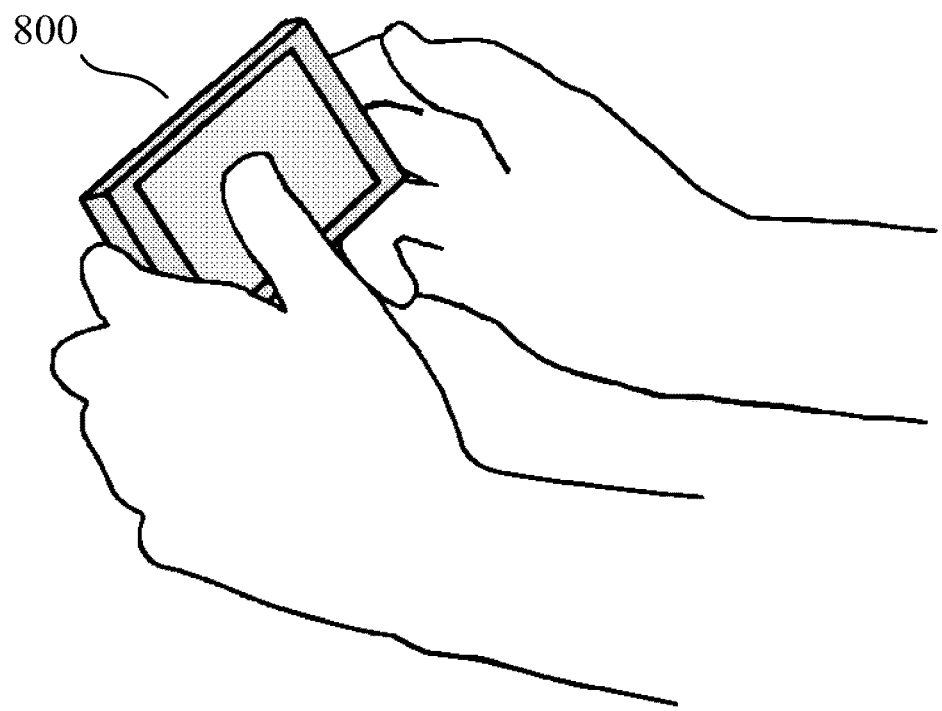
FIG. 11 shows a second typical use configuration (two hands configuration)
Figure 12:
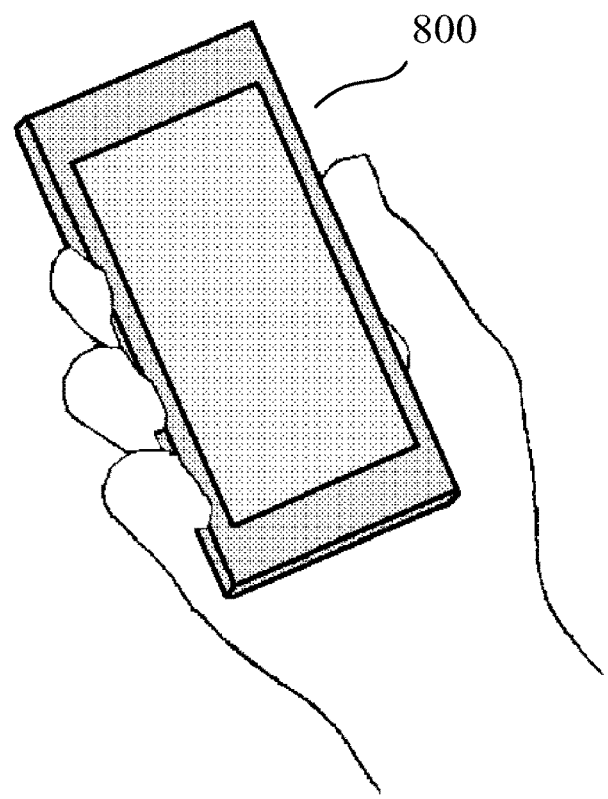
FIG. 12 shows a third typical use configuration (right hand only configuration)

A finite set of typical use configurations is defined. For instance, FIG. 10 shows a first typical use configuration, which may be referred to as the "right hand and head configuration"; FIG. 11 shows a second typical use configuration, which may be referred to as the "two hands configuration"; and FIG. 12 shows a third typical use configuration, which may be referred to as the "right hand only configuration". In FIG. 10, FIG. 11 and FIG. 12, the mobile phone (800) is held by a user. More precisely, the user holds the mobile phone close to his head using his right hand in FIG. 10; the user holds the mobile phone far from his head using both hands in FIG. 11; and the user holds the mobile phone far from his head using his right hand only in FIG. 12. In an actual use configuration, the localization variables assessed by the 4 proximity sensors are used to determine the typical use configuration which is the closest to the actual use configuration. Said at least one of the one or more initial tuning unit adjustment instructions is determined from a set of pre-defined tuning unit adjustment instructions that are stored in a lookup table realized in the transmission and signal processing unit, based on the closest typical use configuration and on the selected frequency. The specialist understands how to build and use such a lookup table. The specialist understands the advantage of defining and using a set of typical use configurations, which must be sufficiently large to cover all relevant cases, and sufficiently small to avoid an excessively large lookup table.

It has been shown that, to obtain a good accuracy of said at least one of the one or more initial tuning unit adjustment instructions, more than two typical use configurations must be defined, and a single localization variable cannot be used to determine a closest typical use configuration. Consequently, in this eleventh embodiment, it is important that a plurality of localization variables is estimated.

Additionally, to be able to determine a closest typical use configuration, it is necessary to use localization variables depending on the distance between a part of a human body and different zones of the apparatus for radio communication. More precisely, it is necessary that there exist two of the localization variables, denoted by A and B, the localization variable A depending on the distance between a part of a human body and a zone X of the apparatus for radio communication, the localization variable B depending on the distance between a part of a human body and a zone Y of the apparatus for radio communication, such that X or Y are distinct, or preferably such that X and Y have an empty intersection. In this eleventh embodiment, this result is obtained by utilizing a localization sensor unit comprising a plurality of proximity sensors, located at different places in the apparatus for radio communication, as shown in FIG. 9.

Twelfth Embodiment

Figure 13:
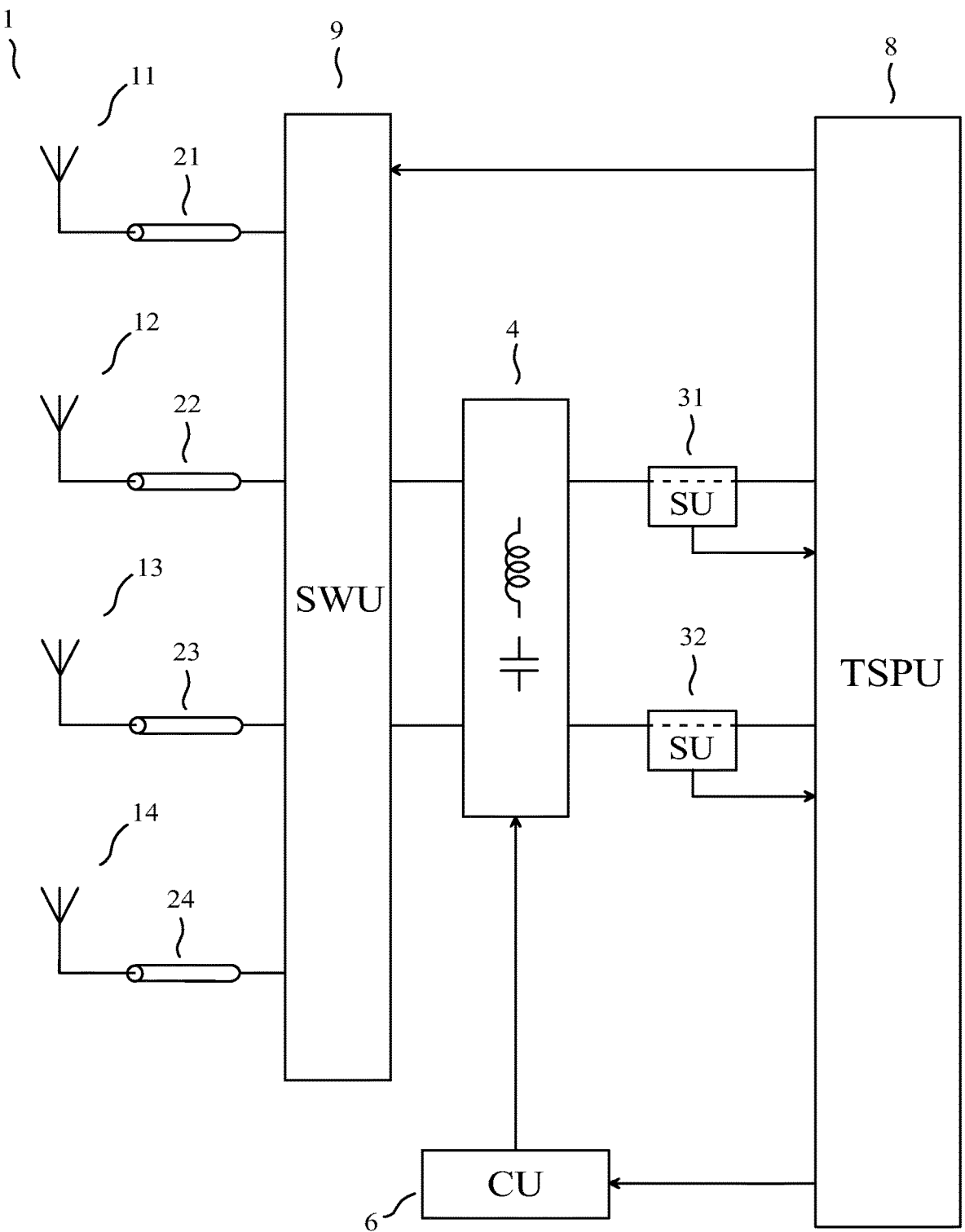
FIG. 13 shows a block diagram of an apparatus for radio communication of the invention (twelfth embodiment).

As a twelfth embodiment of a device of the invention, given by way of non-limiting example, we have represented in FIG. 13 the block diagram of an apparatus for radio communication comprising:
N=4 antennas (11) (12) (13) (14);
a switching unit (9), the switching unit comprising N antenna ports each coupled to one and only one of the antennas through a feeder (21) (22) (23) (24), the switching unit comprising n=2 antenna array ports, the switching unit operating in an active configuration determined by one or more "configuration instructions", the active configuration being one of a plurality of allowed configurations, the switching unit providing, in any one of the allowed configurations, for signals in a given frequency band and for any one of the antenna array ports, a bidirectional path between said any one of the antenna array ports and one and only one of the antenna ports;

a multiple-input-port and multiple-output-port tuning unit (4) having m=2 input ports and n output ports, the apparatus for radio communication allowing, at a given frequency in the given frequency band, a transfer of power from any one of the m input ports to an electromagnetic field radiated by the antennas, the multiple-input-port and multiple-output-port tuning unit comprising p adjustable impedance devices, where p is an integer greater than or equal to m, the p adjustable impedance devices being referred to as the "adjustable impedance devices of the tuning unit" and being such that, at the given frequency, each of the adjustable impedance devices of the tuning unit has a reactance, the reactance of any one of the adjustable impedance devices of the tuning unit being adjustable by electrical means;

m sensing units (31) (32), each of the sensing units delivering one or more "sensing unit output signals", each of the sensing unit output signals being determined by one or more electrical variables sensed (or measured) at one of the input ports;

a transmission and signal processing unit (8), the transmission and signal processing unit selecting a frequency referred to as the "selected frequency", the transmission and signal processing unit delivering the one or more configuration instructions, the transmission and signal processing unit delivering "tuning unit adjustment instructions", at least one of the tuning unit adjustment instructions being an "initial tuning unit adjustment instruction", at least one of the tuning unit adjustment instructions being a "subsequent tuning unit adjustment instruction"; and a control unit (6), the control unit delivering one or more "tuning control signals" to the multiple-input-port and multiple-output-port tuning unit, the control unit generating, for each of the one or more tuning control signals, one or more values of said each of the one or more tuning control signals, each of said one or more values of said each of the one or more tuning control signals being determined as a function of at least one of the tuning unit adjustment instructions, the reactance of each of the adjustable impedance devices of the tuning unit being determined by at least one of the one or more tuning control signals;

the apparatus for radio communication being characterized in that:

the transmission and signal processing unit is used to apply m excitations to the m input ports, one and only one of the excitations being applied to each of the input ports, each of the excitations having a carrier frequency which is equal to the selected frequency;

for each of the one or more tuning control signals, said one or more values of said each of the one or more tuning control signals comprise an initial value determined as a function of one or more of the one or more initial tuning unit adjustment instructions;

the transmission and signal processing unit estimates q tuning parameters by utilizing the sensing unit output signals, where q is an integer greater than or equal to m, each of the tuning parameters being a quantity depending on an impedance matrix presented by the input ports, said impedance matrix presented by the input ports being an impedance matrix presented by the input ports while the one of more initial values are generated; and at least one of the one or more subsequent tuning unit adjustment instructions is determined by utilizing a numerical model of the multiple-input-port and multiple-output-port tuning unit and of the control unit, as a function of:

one or more quantities determined by the selected frequency;

one or more variables determined by one or more of the one or more initial tuning unit adjustment instructions; and the q tuning parameters.

Since said at least one of the one or more subsequent tuning unit adjustment instructions is determined as a function of one or more quantities determined by the selected frequency, it is possible to say that said at least one of the one or more subsequent tuning unit adjustment instructions is determined as a function of the selected frequency. Since said at least one of the one or more subsequent tuning unit adjustment instructions is determined as a function of one or more variables determined by one or more of the one or more initial tuning unit adjustment instructions, it is possible to say that said at least one of the one or more subsequent tuning unit adjustment instructions is determined as a function of one or more of the one or more initial tuning unit adjustment instructions.

The switching unit operates (or is used) in an active configuration determined by the one or more configuration instructions, the active configuration being one of a plurality of allowed configurations, the switching unit providing, in any one of the allowed configurations, for signals in the given frequency band and for any one of the antenna array ports, a path between said any one of the antenna array ports and one of the antenna ports. Thus, the switching unit operates in an active configuration which is one of the allowed configurations, and each allowed configuration corresponds to a selection of n antenna ports among the N antenna ports. It is also possible to say that the switching unit operates in an active configuration corresponding to a selection of n antenna ports among the N antenna ports.

Each allowed configuration corresponds to a selection of n antenna ports among the N antenna ports, the switching unit providing, for signals in the given frequency band and for any one of the antenna array ports, a path between said any one of the antenna array ports and one of the selected antenna ports. This path may preferably be a low loss path for signals in the given frequency band. The specialist understands that a suitable switching unit may comprise one or more electrically controlled switches and/or change-over switches. In this case, one or more of said electrically controlled switches and/or change-over switches may for instance be an electro-mechanical relay, or a microelectro-mechanical switch, or a circuit using one or more PIN diodes and/or one or more insulated-gate field-effect transistors as switching devices.

In this twelfth embodiment, it is not possible to say that, for each of the antennas, the signal port of the antenna is coupled, directly or indirectly, to one and only one of the output ports. However, in this twelfth embodiment, each of the n output ports is, at a given time, coupled to one and only one of the N antennas. More precisely, each of the n output ports is, at any given time except during a change of active configuration, indirectly coupled to the signal port of one and only one of the N antennas, through the switching unit and one and only one of the feeders.

The apparatus for radio communication is a radio transmitter or a radio transceiver, so that the transmission and signal processing unit (8) also performs functions which have not been mentioned above, and which are well known to specialists. The apparatus for radio communication uses simultaneously, in the given frequency band, n antennas among the N antennas, for MIMO radio emission and/or for MIMO radio reception. The given frequency band only contains frequencies greater than or equal to 300 MHz.

For instance, each of the one or more configuration instructions may be determined as a function of:
one or more localization variables, defined as in the tenth embodiment;
the selected frequency, or a frequency used for radio communication with the antennas;
one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

The elements of said set of additional variables may further comprise one or more variables which are different from the localization variables and which characterize the grip with which a user is holding the apparatus for radio communication.

Each of the one or more configuration instructions may for instance be determined using a lookup table.

Each of the one or more configuration instructions may be of any type of digital message. Each of the tuning unit adjustment instructions may be of any type of digital message. The one or more configuration instructions and the tuning unit adjustment instructions are delivered during several adjustment sequences. The transmission and signal processing unit begins an adjustment sequence when one or more configuration instructions are delivered. The transmission and signal processing unit ends the adjustment sequence when the last tuning unit adjustment instruction of the adjustment sequence has been delivered. The duration of an adjustment sequence is less than 100 microseconds.

In order to respond to variations in the electromagnetic characteristics of the volume surrounding the antennas and/or in the frequency of operation, adjustment sequences may take place repeatedly. For instance, a new adjustment sequence may start periodically, for instance every 10 milliseconds.

Thirteenth Embodiment

The thirteenth embodiment of a device of the invention, given by way of non-limiting example, also corresponds to the apparatus for radio communication shown in FIG. 3, and all explanations provided for the first embodiment are applicable to this thirteenth embodiment.

In this thirteenth embodiment, an exact numerical model of the multiple-input-port and multiple-output-port tuning unit and of the control unit may be put in the form of a mapping denoted by $g_{EU}$ and defined by $$g_{EU}(f, Z_{Sant}, t_C, a_T) = Z_U \quad (25)$$

where f is the frequency, where $t_C$ is the applicable tuning unit adjustment instruction, $t_C$ lying in a set of possible tuning unit adjustment instructions, this set being denoted by $T_C$, and where $a_T$ is a real vector of temperatures, which is sufficient to characterize the effects of temperature on $Z_U$. As an example, if the impedance of each of the adjustable impedance devices of the tuning unit depends on its temperature, and if the characteristics of the control unit do not significantly depend on temperature, the elements of $a_T$ could for instance be the temperatures of the adjustable impedance devices of the tuning unit, or $a_T$ could for instance have a single element, this single element being a common temperature applicable to each of the adjustable impedance devices of the tuning unit, if such a common temperature exists.

As in the sixth embodiment, an adjustment sequence is intended to be such that, at the end of said adjustment sequence, the impedance matrix presented by the input ports is close to a wanted impedance matrix, denoted by $Z_W$. The transmission and signal processing unit knows an approximate numerical model of the multiple-input-port and multiple-output-port tuning unit and of the control unit, this approximate numerical model corresponding to a mapping denoted by $g_{AU}$, such that $$g_{AU}(f, Z_{Sant}, t_C, a_T) + d_{AU}(f, Z_{Sant}, t_C, a_T) = Z_U \quad (26)$$

where the mapping $d_{AU}$ represents the error of the approximate numerical model, and is not known to the transmission and signal processing unit.

An adjustment sequence comprises the following steps: an initial tuning unit adjustment instruction $t_{CI}$ is delivered by the transmission and signal processing unit; the transmission and signal processing unit estimates q tuning parameters, which provide a measurement $Z_{UIM}$ of $Z_{UI}$, where $Z_{UI}$ is the value of $Z_U$ at the selected frequency $f_C$ while $t_{CI}$ is applicable; and a subsequent tuning unit adjustment instruction $t_{CS}$ is computed as explained below, and delivered by the transmission and signal processing unit.

While $t_{CI}$ is applicable, (that is while, for each of the one or more tuning control signals, the control unit generates a value determined as a function of $t_{CI}$), we have $$g_{AU}(f_C, Z_{Sant}, t_{CI}, a_T) + d_{AU}(f_C, Z_{Sant}, t_{CI}, a_T) = Z_{UI} \quad (27)$$

Let $a_{TM}$ be an estimated value of $a_T$, which may for instance be obtained using one or more temperature measurements. The transmission and signal processing unit solves the equation $$g_{AU}(f_C, Z_{SantE}, t_{CI}, a_{TM}) = Z_{UIM} \quad (28)$$

with respect to the unknown $Z_{SantE}$, to obtain an estimated value $Z_{SantE}$ of $Z_{Sant}$. Thus, we have $$Z_{UI} - Z_{UIM} = g_{AU}(f_C, Z_{Sant}, t_{CI}, a_T) - \\ g_{AU}(f_C, Z_{SantE}, t_{CI}, a_{TM}) + d_{AU}(f_C, Z_{Sant}, t_{CI}, a_T) \quad (29)$$

$Z_{SantE}$ and $a_{TM}$ are used by a suitable algorithm, to obtain $t_{CS}$ such that $g_{AU}(f_C, Z_{SantE}, t_{CS}, a_{TM})$ is as close as possible to the wanted impedance matrix $Z_W$. We may write $$g_{AU}(f_C, Z_{SantE}, t_{CS}, a_{TM}) + d_{QCL2}(f_C, Z_{SantE}, t_{CS}, a_{TM}) = Z_W \quad (30)$$

where the mapping $d_{QCL2}$ represents a quantization error which is known to the transmission and signal processing unit, but which cannot be avoided because there is no $t_C$ in $T_C$ such that $g_{AU}(f_C, Z_{SantE}, t_{CS}, a_{TM})$ is closer to $Z_W$. The resulting value of $Z_U$ at $f_C$ while $t_{CS}$ is applicable (that is while, for each of the one or more tuning control signals, the control unit generates a value determined as a function of $t_{CS}$) is given by $$g_{AU}(f_C, Z_{Sant}, t_{CS}, a_T) + d_{AU}(f_C, Z_{Sant}, t_{CS}, a_T) = Z_U \quad (31)$$

Thus, the error of the adjustment sequence while $t_{CS}$ is applicable is given by $$Z_U - Z_W = g_{AU}(f_C, Z_{Sant}, t_{CS}, a_T) - g_{AU}(f_C, Z_{SantE}, t_{CS}, a_{TM}) + d_{AU}(f_C, Z_{Sant}, t_{CS}, a_T) - d_{QCL2}(f_C, Z_{SantE}, t_{CS}, a_{TM}) \quad (32)$$

Let us use $D_{AU}$ to denote the mapping such that $$D_{AU}(f_C, Z_{Sant}, Z_{SantE}, t_{CS}, t_{CI}, a_T, a_{TM}) = g_{AU}(f_C, Z_{Sant}, t_{CS}, a_T) - g_{AU}(f_C, Z_{SantE}, t_{CS}, a_{TM}) + d_{AU}(f_C, Z_{Sant}, t_{CS}, a_T) - [g_{AU}(f_C, Z_{Sant}, t_{CI}, a_T) - g_{AU}(f_C, Z_{SantE}, t_{CI}, a_{TM}) + d_{AU}(f_C, Z_{Sant}, t_{CI}, a_T)] \quad (33)$$

For any values of $f_C$, $Z_{Sant}$, $Z_{SantE}$, $t_{CI}$, $a_T$ and $a_{TM}$, we have $$D_{AU}(f_C, Z_{Sant}, Z_{SantE}, t_{CI}, t_{CI}, a_T, a_{TM}) = 0_{mm} \quad (34)$$

where $0_{mm}$ is the null matrix of size m by m. It follows from equation (29) and equation (33) that $$Z_{UT} - Z_{UIM} + D_{AU}(f_C, Z_{Sant}, Z_{SantE}, t_{CS}, t_{CI}, a_T, a_{TM}) = g_{AU}(f_C, Z_{Sant}, t_{CS}, a_T) - g_{AU}(f_C, Z_{SantE}, t_{CS}, a_{TM}) + d_{AU}(f_C, Z_{Sant}, t_{CS}, a_T) \quad (35)$$

Substituting equation (35) in equation (32), we can write that the error of the adjustment sequence while $t_{CS}$ is applicable is given by $$Z_U - Z_W = Z_{UT} - Z_{UIM} + D_{AU}(f_C, Z_{Sant}, Z_{SantE}, t_{CS}, t_{CI}, a_T, a_{TM}) - d_{QCL2}(f_C, Z_{SantE}, t_{CS}, a_{TM}) \quad (36)$$

By equation (28), $Z_{SantE}$ may be regarded as a function of $f_C$, $t_{CI}$, $a_{TM}$ and $Z_{UIM}$. Thus, by equation (30), $t_{CS}$ may be regarded as a function of $f_C$, $t_{CI}$, $a_{TM}$, $Z_{UIM}$ and $Z_W$. Thus, by equation (33), $D_{AU}(f_C, Z_{Sant}, Z_{SantE}, t_{CS}, t_{CI}, a_T, a_{TM})$ may be regarded as a function of $f_C$, $Z_{Sant}$, $t_{CI}$, $a_T$, $a_{TM}$, $Z_{UIM}$ and $Z_W$. Thus, we can define a mapping $E_{AU}$ such that $$E_{AU}(f_C, Z_{Sant}, t_{CI}, a_T, a_{TM}, Z_{UIM}, Z_W) = D_{AU}(f_C, Z_{Sant}, Z_{SantE}, t_{CS}, t_{CI}, a_T, a_{TM}) \quad (37)$$

If $Z_{UIM} = Z_W$ the transmission and signal processing unit believes that it has reached $Z_W$, so that $t_{CS} = t_{CI}$. Thus, using equation (34) and equation (37), we obtain that, for any values of $f_C$, $Z_{Sant}$, $t_{CI}$, $a_T$, $a_{TM}$ and $Z_W$, we have $$E_{AU}(f_C, Z_{Sant}, t_{CI}, a_T, a_{TM}, Z_W, Z_W) = 0_{mm} \quad (38)$$

With respect to the variable $Z_{UIM}$ of equation (37), the mapping $E_{AU}$ is probably neither smooth nor continuous, because of the quantization error and possibly other reasons. However, the multiple-input-port and multiple-output-port tuning unit, the control unit, and the transmission and signal processing unit are such that, with respect to the variable $Z_{UIM}$, the mapping $E_{AU}$ may approximately be considered as continuous. Thus, by equation (38), if $Z_{UIM}$ is sufficiently close to $Z_W$, then $E_{AU}(f_C, Z_{Sant}, t_{CI}, a_T, a_{TM}, Z_{UIM}, Z_W)$ is close to $0_{mm}$ and $D_{AU}(f_C, Z_{Sant}, Z_{SantE}, t_{CS}, t_{CI}, a_T, a_{TM})$ is close to $0_{mm}$. Thus, if $Z_{UIM}$ is sufficiently close to $Z_W$, the error of the adjustment sequence while $t_{CS}$ is applicable satisfies $$Z_U - Z_W \approx Z_{UT} - Z_{UIM} - d_{QCL2}(f_C, Z_{SantE}, t_{CS}, a_{TM}) \quad (39)$$

According to equation (39), the error of the adjustment sequence while $t_{CS}$ is applicable is almost equal to the measurement error $Z_{UT} - Z_{UIM}$ less the quantization error. If we compare equation (39) to equation (36), we observe that a cancellation of errors has occurred. Also, the error given by equation (39) is to a large extent independent of the accuracy of the approximate numerical model.

The adjustment sequence described above uses the approximate numerical model of the multiple-input-port and multiple-output-port tuning unit and of the control unit twice, the first time when it solves equation (28) to obtain $Z_{SantE}$, and the second time when said suitable algorithm is used to obtain $t_{CS}$ such that $g_{AU}(f_C, Z_{SantE}, t_{CS}, a_{TM})$ is as close as possible to the wanted impedance matrix $Z_W$. We have shown that, provided $Z_{UIM}$ is sufficiently close to $Z_W$, the inaccuracies in the approximate numerical model of the multiple-input-port and multiple-output-port tuning unit and of the control unit have a reduced effect on the accuracy of the resulting $Z_U$. Thus, the adjustment sequence described above is accurate.

It is important to note that this adjustment sequence does not use any known value of the reactance of any one of the adjustable impedance devices of the tuning unit, to obtain the estimated value $Z_{SantE}$ of $Z_{Sant}$. If this was the case, the adjustment sequence would not use the approximate numerical model of the multiple-input-port and multiple-output-port tuning unit and of the control unit twice, and the above-mentioned cancellation of error would not occur, so that the accuracy of the resulting $Z_U$ would be degraded.

Fourteenth Embodiment

The fourteenth embodiment of a device of the invention, given by way of non-limiting example, also corresponds to the apparatus for radio communication shown in FIG. 3, and all explanations provided for the first embodiment and for the thirteenth embodiment are applicable to this fourteenth embodiment.

In this fourteenth embodiment, the apparatus for radio communication is such that, in an adjustment sequence, $Z_{UIM}$ is sufficiently close to $Z_W$ to obtain that the error of the adjustment sequence while $t_{CS}$ is applicable satisfies equation (39).

For the reasons provided in the presentation of the thirteenth embodiment, we can say that the adjustment sequence uses the approximate numerical model of the multiple-input-port and multiple-output-port tuning unit and of the control unit twice, and that this characteristic is used to obtain that the inaccuracies in the approximate numerical model of the multiple-input-port and multiple-output-port tuning unit and of the control unit have a reduced effect on the accuracy of the resulting $Z_U$. Thus, said adjustment sequence is accurate.

Fifteenth Embodiment

The fifteenth embodiment of a device of the invention, given by way of non-limiting example, also corresponds to the apparatus for radio communication shown in FIG. 3, and all explanations provided for the first embodiment and for the thirteenth embodiment are applicable to this fifteenth embodiment.

In this fifteenth embodiment, the apparatus for radio communication is such that a first adjustment sequence has used a $Z_{UIM}$, which need not be sufficiently close to $Z_W$ to obtain that the error of the first adjustment sequence while its $t_{CS}$ is applicable satisfies equation (39). At the end of the first adjustment sequence, the error is given by equation (36). This first adjustment sequence is quickly followed by a second adjustment sequence, such that the subsequent tuning unit adjustment instruction of the first adjustment sequence becomes the initial tuning unit adjustment instruction of the second adjustment sequence.

In this fifteenth embodiment, the apparatus for radio communication is such that the second adjustment sequence uses an initial tuning unit adjustment instruction such that $Z_{UIM'}$ is sufficiently close to $Z_W$ to obtain that the error of the second adjustment sequence while its $t_{CS}$ is applicable satisfies equation (39).

For the reasons provided in the presentation of the thirteenth embodiment, we can say that the inaccuracies in the approximate numerical model of the multiple-input-port and multiple-output-port tuning unit and of the control unit have a reduced effect on the accuracy of the resulting $Z_U$ at the end of the second adjustment sequence. Thus, the combination of the first adjustment sequence and of the second adjustment sequence is accurate, because, in this combination, the transmission and signal processing unit estimates the tuning parameters twice, and delivers a subsequent tuning unit adjustment instruction twice (so that the combination of the first adjustment sequence and of the second adjustment sequence uses the approximate numerical model of the multiple-input-port and multiple-output-port tuning unit and of the control unit four times).

Sixteenth Embodiment

The sixteenth embodiment of a device of the invention, given by way of non-limiting example, also corresponds to the apparatus for radio communication shown in FIG. 3, and all explanations provided for the first embodiment are applicable to this sixteenth embodiment.

An adjustment sequence of this sixteenth embodiment comprises the first adjustment sequence of the fifteenth embodiment and the second adjustment sequence of the fifteenth embodiment.

For the reasons provided in the presentation of the fifteenth embodiment, we can say that the inaccuracies in the approximate numerical model of the multiple-input-port and multiple-output-port tuning unit and of the control unit have a reduced effect on the accuracy of the resulting $Z_U$ at the end of the adjustment sequence. Thus, the adjustment sequence is accurate, because, in the adjustment sequence, the transmission and signal processing unit estimates the tuning parameters twice, and delivers a subsequent tuning unit adjustment instruction twice (so that the adjustment sequence uses the approximate numerical model of the multiple-input-port and multiple-output-port tuning unit and of the control unit four times).

INDICATIONS ON INDUSTRIAL APPLICATIONS

The method of the invention is a fast and accurate method for automatically adjusting a multiple-input-port and multiple-output-port tuning unit, and a fast and accurate method for automatically tuning an impedance matrix. The apparatus for radio communication of the invention can quickly, accurately and automatically adjust its multiple-input-port and multiple-output-port tuning unit, to quickly, accurately and automatically tune an impedance matrix.

All embodiments described above comprise N=4 antennas, but this is not at all a characteristic of the invention. In the multiple-input-port and multiple-output-port tuning unit used in the seventh embodiment, shown in FIG. 5, and in the multiple-input-port and multiple-output-port tuning unit used in the eighth embodiment, shown in FIG. 6, the adjustable impedance devices of the tuning unit each present a negative reactance, but this is not at all a characteristic of the invention.

The apparatus for radio communication of the invention may for instance be a radio transmitter using a plurality of antennas simultaneously, or a radio transceiver using a plurality of antennas simultaneously. Thus, the method and the apparatus for radio communication of the invention are suitable for MIMO radio communication.

The method and the apparatus for radio communication of the invention provide the best possible characteristics using very close antennas, hence presenting a strong interaction between them. The invention is therefore particularly suitable for mobile radio transmitters and transceivers, for instance those used in portable radiotelephones or portable computers.

The method and the apparatus for radio communication of the invention provide the best possible characteristics using a very large number of antennas in a given volume, hence presenting a strong interaction between them. The invention is therefore particularly suitable for high-performance radio transmitters and transceivers, for instance those used in the fixed stations of cellular radiotelephony networks.

The invention claimed is:

1. A method for automatically adjusting a multiple-input-port and multiple-output-port tuning unit, the multiple-input-port and multiple-output-port tuning unit having m input ports and n output ports, where m and n are each an integer greater than or equal to 2, the multiple-input-port and multiple-output-port tuning unit comprising p adjustable impedance devices, where p is an integer greater than or equal to m, the p adjustable impedance devices being referred to as the adjustable impedance devices of the tuning unit and being such that, at a given frequency, each of the adjustable impedance devices of the tuning unit has a reactance, the reactance of any one of the adjustable impedance devices of the tuning unit being adjustable by electrical means, the reactance of any one of the adjustable impedance devices of the tuning unit being determined at least in part based on at least one tuning control signal, the multiple-input-port and multiple-output-port tuning unit being a part of an apparatus for radio communication comprising N antennas, where N is an integer greater than or equal to 2, the apparatus for radio communication allowing, at the given frequency, a transfer of power from the m input ports to an electromagnetic field radiated by the antennas, the method comprising the steps of:

selecting a frequency referred to as the selected frequency;

applying m excitations to the m input ports, one and only one of the excitations being applied to each of the input ports, each of the excitations having a carrier frequency which is equal to the selected frequency;

generating, for each of the one or more tuning control signals, an initial value of said each of the one or more tuning control signals, as a function of one or more initial tuning unit adjustment instructions;

sensing one or more electrical variables at each of the input ports, to obtain sensing unit output signals, each of the sensing unit output signals being determined at least in part based on at least one of the electrical variables sensed at one of the input ports;

estimating q tuning parameters by utilizing the sensing unit output signals, where q is an integer greater than or equal to m, each of the tuning parameters being a quantity depending on an impedance matrix presented by the input ports, said impedance matrix presented by the input ports being an impedance matrix presented by the input ports while each said initial value is generated; and generating, for at least one of the one or more tuning control signals, at least one subsequent value of said at least one of the one or more tuning control signals, as a function of:
- one or more quantities determined by the selected frequency;
- one or more variables determined by one or more of the one or more initial tuning unit adjustment instructions; and
- the q tuning parameters.

2. The method of claim 1, wherein at least one of the one or more subsequent values is generated by utilizing a numerical model.

3. The method of claim 2, wherein a value of the selected frequency lies in a set of a plurality of possible values.

4. The method of claim 2, wherein them excitations are applied successively to the input ports.

5. The method of claim 2, wherein each of the excitations has one and only one complex envelope, the m complex envelopes of the m excitations being linearly independent in the set of complex functions of one real variable, regarded as a vector space over the field of complex numbers.

6. The method of claim 5, wherein two or more of the excitations are applied simultaneously to the input ports.

7. The method of claim 2, wherein n=m, and wherein the multiple-input-port and multiple-output-port tuning unit is composed of n single-input-port and single-output-port tuning units each comprising one or more of said adjustable impedance devices of the tuning unit.

8. The method of claim 2, wherein the multiple-input-port and multiple-output-port tuning unit is such that, at the given frequency, there exists a diagonal impedance matrix referred to as the given diagonal impedance matrix, the given diagonal impedance matrix being such that, if an impedance matrix seen by the output ports is equal to the given diagonal impedance matrix, then the reactance of any one of the adjustable impedance devices of the tuning unit has an influence on an impedance matrix presented by the input ports.

9. The method of claim 8, wherein the multiple-input-port and multiple-output-port tuning unit is such that, at the given frequency, if the impedance matrix seen by the output ports is equal to the given diagonal impedance matrix, then the reactance of at least one of the adjustable impedance devices of the tuning unit has an influence on at least one non-diagonal entry of the impedance matrix presented by the input ports.

* * * * *